United States Patent
Yang et al.

(10) Patent No.: US 8,003,497 B2
(45) Date of Patent: Aug. 23, 2011

(54) DILUTED MAGNETIC SEMICONDUCTOR NANOWIRES EXHIBITING MAGNETORESISTANCE

(75) Inventors: Peidong Yang, El Cerrito, CA (US); Heonjin Choi, Seoul (KR); Sangkwon Lee, Daejeon (KR); Rongrui He, Albany, CA (US); Yanfeng Zhang, El Cerrito, CA (US); Tevye Kuykendal, Berkeley, CA (US); Peter Pauzauskie, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 1381 days.

(21) Appl. No.: 11/480,280

(22) Filed: Jun. 29, 2006

(65) Prior Publication Data

US 2009/0294908 A1    Dec. 3, 2009

Related U.S. Application Data

(63) Continuation of application No. PCT/US2005/001415, filed on Jan. 14, 2005.

(60) Provisional application No. 60/536,569, filed on Jan. 14, 2004.

(51) Int. Cl.
    *H01L 21/20* (2006.01)
(52) U.S. Cl. ............ 438/478; 438/3; 438/931; 977/762; 257/E43.001
(58) Field of Classification Search ............... 438/3, 478, 438/507, 509, 931; 977/762; 257/E43.001
See application file for complete search history.

(56) References Cited

U.S. PATENT DOCUMENTS

| | | | |
|---|---|---|---|
| 6,130,143 A | 10/2000 | Westwater et al. | |
| 6,176,925 B1 | 1/2001 | Solomon et al. | |
| 6,586,095 B2 | 7/2003 | Wang et al. | |
| 7,575,631 B2 * | 8/2009 | Byeun et al. | 438/510 |
| 2002/0130311 A1 | 9/2002 | Lieber et al. | |
| 2002/0172820 A1 | 11/2002 | Majumdar et al. | |
| 2002/0175408 A1 | 11/2002 | Majumdar et al. | |
| 2003/0010971 A1 | 1/2003 | Zhang et al. | |
| 2003/0039602 A1 | 2/2003 | Sharma et al. | |

OTHER PUBLICATIONS

Stach, E.A.; Pauzauskie, P.J.; Kuykendall, T.; Goldberger, J.; He, R.; Yang, P. "Watching GaN nanowires grow", Nano Letters, vol. 3, No. 6, pp. 867-869 (2003).

Zhang, J.; Zhang, L. "Growth of semiconductor gallium nitride nanowires with different catalysts", J. Vac. Sci. Technol. B. vol. 21, No. 6, pp. 2415-2419 (2003).

Kuykendall, T. et al.—"Metalorganic Chemical Vapor Deposition Rout to GaN Nanowires with Triangular Cross Sections"—Nano Letters, vol. 3, No. 8, 2003, pp. 1063-1066.

Zhong, Z. et al.—"Synthesis of p-Type Gallium Nitride Nanowires for Electronic and Photonic Nanodevices"—Nano Letters, vol. 3, No. 3, 2003, pp. 343-346.

Deepak, F.L. et al.—"Photoluminescence spectra and ferromagnetic properties of GaMnN nanowires"—Chemical Physical Letters 374, 2003, pp. 314-318.

* cited by examiner

Primary Examiner — Jack Chen
(74) Attorney, Agent, or Firm — John P. O'Banion

(57) ABSTRACT

A method for is disclosed for fabricating diluted magnetic semiconductor (DMS) nanowires by providing a catalyst-coated substrate and subjecting at least a portion of the substrate to a semiconductor, and dopant via chloride-based vapor transport to synthesize the nanowires. Using this novel chloride-based chemical vapor transport process, single crystalline diluted magnetic semiconductor nanowires $Ga_{1-x}Mn_xN$ (x=0.07) were synthesized. The nanowires, which have diameters of ~10 nm to 100 nm and lengths of up to tens of micrometers, show ferromagnetism with Curie temperature above room temperature, and magnetoresistance up to 250 Kelvin.

29 Claims, 22 Drawing Sheets

DILUTED MAGNETIC SEMICONDUCTOR NANOWIRES EXHIBITING MAGNETORESISTANCE

CROSS-REFERENCE TO RELATED APPLICATIONS

This application claims priority from, and is a 35 U.S.C. §111(a) continuation of, co-pending PCT international application serial number PCT/US2005/001415, filed on Jan. 14, 2005, incorporated herein by reference in its entirety, which designates the U.S., which claims priority from provisional application Ser. No. 60/536,569, filed on Jan. 14, 2004, incorporated herein by reference in its entirety.

STATEMENT REGARDING FEDERALLY SPONSORED RESEARCH OR DEVELOPMENT

This invention was made with Government support under Grant No. DE-FG03-02ER46021, awarded by the Department of Energy, and under Grant No. DMR-0092086, awarded by the National Science Foundation. The Government has certain rights in this invention.

This application is also related to PCT International Publication Numbers WO 2005/067547 A2 and WO 2005/067547 A2, each of which is incorporated herein by reference in its entirety.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to semiconductor nanowires, and more particularly to diluted magnetic semiconductor nanowires.

2. Incorporation by Reference of Publications

The following publications referenced herein using numbers inside brackets (e.g., [1]) are incorporated by reference herein in their entirety:

[1]: S. D. Sarma, Ferromagnetic semiconductor: A giant appears in spintronics, Nature Mater. 2, 292-294 (2003).

[2] S. P. Pearton et al., Wide band gap ferromagnetic semiconductors and oxides, J. Appl. Phys. 93, 1-13 (2003).

[3] H. Akinaga, H. Ohno, Semiconductor spintronics, IEEE Trans. Nanotech. 1, 19-31 (2002).

[4] T. Dietl, Ferromagnetic semiconductors, Semicond. Sci. Technol. 17, 377-392 (2002).

[5] Malajovich, J. J. Berry, N. Samarth, D. D. Awschalom, Persistent sourcing of coherent spins for multifunctional semiconductor spintronics, Nature, 411, 770-772 (2001).

[6] H. Ohno, Making nonmagnetic semiconductor magnetic, Science, 281, 951-956 (1998)

[7] S. Wolf et al., Spintronics: a spin based electronics vision for the future, Science, 294, 1488-1495 (2001).

[8] T. Dietl, H. Ohno, F. Matsukura, J. Cibert, D. Ferrand, Zener model description of ferromagnetism in zinc-blende magnetic semiconductors, Science, 287, 1019-1022 (2000).

[9] K. H. Kim et al., Magnetotransport of p-type GaMnN assisted by highly conductive precipitates, Appl. Phys. Lett. 82, 1775-1777 (2003).

[10] H. Hori et al., High T. ferromagnetism in diluted magnetic semiconducting GaN:Mn films, Physica B 324, 142-150 (2002).

[11] M. C. Park et al., Room temperature ferromagnetic (Ga, Mn)N epitaxial films with low Mn concentration grown by plasma-enhanced molecular beam epitaxy, Solid State Commun. 124, 11-14 (2002).

[12] M. L. Reed et al., Room temperature ferromagnetic properties of (Ga, Mn)N, Appl Phys. Lett. 79, 3473-3475 (2001).

[13] M. Zajac et al., Paramagnetism and antiferromagnetic d-d coupling in GaMnN magnetic semiconductor, Appl. Phys. Lett. 79, 2432-2434 (2001).

[14] Y. Soon et al., Optical and magnetic measurements of p-type GaN epilayers implanted with $Mn^+$ ions, Appl. Phys. Lett. 81, 1845-1847 (2002).

[15] N. Theodoropoulou et al., Magnetic and structural properties of Mn-implanted GaN, Appl. Phys. Lett. 78, 3475-3477 (2001).

[16] M. E. Overberg et al., Indication of ferromagnetism in molecular-beam-epitaxy derived n-type GaMnN, Appl. Phys. Lett. 79, 1312-1314 (2001).

[17] Y. Xia, P. Yang Eds., Special issue on one-dimensional nanostructures, Adv. Mater. 15 (5), 2003.

[18] H. Choi, J. Johnson, R. He, S. Lee, F. Kim, P. Pauzauskie, J. Goldberger, R. Saykally, P. Yang, Self-organized GaN quantum wire lasers, J. Phys. Chem. B, 2003, In press.

[19] Z. L. Wang, J. S. Yin, Y. D. Jiang, EELS analysis of cation valence states and oxygen vacancies in magnetic oxides, Micron, 31, 571-580 (2000).

[20] Shon, Y et al., Optical characterization of $Mn^+$ ion implanted GaN epilayers, J. Crys. Growth, 245, 193-197 (2002)

[21] K. H. Kim et al. Enhanced carrier-mediated ferromagnetism in GaMnN by codoping Mg, Appl. Phys. Lett. 82, 4755-4757 (2003).

[22] L. J. Lauhoni, M. S. Gudiksen, D. Wang, C. M. Lieber, Epitaxial core-shell and core-multishell nanowire heterostructures, Nature, 420, 57-161 (2002).

[23] R. He, M. Law, R. Fan, F. Kim, P. Yang, Functional bimorph composite nanotapes, Nanolett., 2, 1109-1112 (2002).

[24] Z. Zhang et al. Magnetotransport investigations of ultrafine single-crystalline bismuth nanowire arrays, Appl. Phys. Lett. 73, 1589-1591 (1998).

[25] Jin, S. et al., Thousand-fold change in the resistivity in magnetoresistive La—Ca—MnO films, Science, 264, 413-415 (1994).

[26] Shimakawa, Y, Kubo, Y & Manako, T., Giant magnetoresistance in $Tl_2Mn_2O_7$ with the pyrochlore structure, Nature, 379, 53-55 (1996).

[27] Solin, S. A.; Thio, T.; Hines, D. R.; Heremans, J. J., Enhanced room-temperature geometric magnetoresistance in inhomogeneous narrow-gap semiconductors, *Science*, 289, 1530-1-532 (2000).

[28] Y. Matsumoto et al., Room-temperature ferromagnetism in transparent transition metal-doped titanium dioxide, *Science*, 291, 854-856 (2001).

[29] T. Fukumura et al., An oxide-diluted magnetic semiconductor: Mn-doped ZnO, *Appl. Phys. Lett.* 75, 3366-3368 (1999).

[30] Manala N. Sidis Y, DiTusa J. F., Aeppil G Young, D. P., Fisk, Z. Magnetoresistance from quantum interference effects in ferromagnets, *Nature*, 404, 581584 (2000).

3. Description of Related Art

Current information technology relies on two independent processes: charge-based information processing (microprocessors) and spin-based data storage (magnetic hard drives). [1-5] The perspective of simultaneously manipulating both charge and spin in a single semiconductor medium leads to the exciting area of spintronics. [1-7] Among many others, diluted magnetic semiconductors (DMSs) represent the most promising candidates for such applications. Theoretical studies indicate that transition metal doped GaN possesses ferromagnetic transition temperature higher than room temperature, which would be advantageous for many of the proposed spintronic applications. [8] Many experiments have already been carried out to demonstrate such a hypothesis, [9-11] although significant controversy exists over the possible magnetic impurity phase separation for these thin-films. [12-16]. Moreover, intrinsic defects in these films originated from the non-equilibrium molecular beam epitaxial growth process hinder a fundamental understanding of the ferromagnetism in these materials.

On the other hand, the miniaturization of electronic devices represents an everlasting trend for both industrial manufacture and academic research. Among many other materials, nanotubes and nanowires are being actively explored as possible building blocks for electronic devices of sub 100 nm and smaller. [17] The controlled fabrication and fundamental understanding of low-dimensional ferromagnetic semiconductor nanostructures is thus crucial to the development of semiconductor-based spintronic devices and spin-based quantum computation schemes.

Although progress has been made in the understanding of DMS quantum wells and dots, [1-7] studies on DMS quantum wires are still at a nascent stage. Dimensionality and size are known to play significant roles in determining various properties of the system. In this regard, one dimensional DMS systems in nanometer scale, i.e., DMS nanowires, are expected to have interesting magnetoelectronic properties and could be good candidates for realizing spintronic devices for several reasons. First, nanowires themselves are attractive building blocks for nanoscale electronic and optoelectronic devices; second, magnetic nanowires could act as spin filters to supply spin polarized carrier currents and can have large magnetic anisotropy energy; third, carriers could be confined in the radial direction of nanowires and, therefore, high carrier concentrations and efficient injection of spin polarized carriers could potentially be achieved.

Synthesis of DMS nanowires, however, represents a challenging issue, which has only recently been achieved in an epitaxial nanotape geometry. To carry out meaningful investigation on DMS nanowires, the ideal wires should be single crystalline and the transition metal dopant must be homogeneously distributed without phase separation. The synthetic challenge resides in the limited transition metal equilibrium solubility in semiconductors as well as intrinsic difficulty in nanocrystal doping. Processes like molecular beam epitaxy (MBE) and implantation have shown limited success in preparing DMSs from III-V semiconductors, particularly the GaN system. [9-16]

BRIEF SUMMARY OF THE INVENTION

The foregoing technical difficulties have been successfully overcome in accordance with the present invention, single crystalline GaN:Mn nanowires have been fabricated in a controlled manner via a unique chloride-based chemical vapor transport process. More particularly, single crystalline diluted magnetic semiconductor nanowires $Ga_{1-x}Mn_xN$ (x=0.01-0.09) have been synthesized. These nanowires, which have diameters of approximately 10 nm to 100 nm and lengths of up to tens of micrometers, show ferromagnetism with Curie temperature above 300 Kelvin (K) and magnetoresistance (MR) up to 250 K. Spin-dependent electron transport from single nanowire transistors indicates the homogeneous nature of the ferromagnetic nanowires. Gate dependent conductance and electroluminescence (EL) from nanowire-based light emitting diode structures unambiguously showed their p-type characteristics, which support the theory of hole mediated ferromagnetism.

An aspect of the invention is a method for fabricating diluted magnetic semiconductor (DMS) nanowires, comprising providing a catalyst-coated substrate and subjecting at least a portion of the substrate to a semiconductor-based solution and a dopant-based solution, wherein the dopant-based solution comprises a dopant and a chloride-based vapor transport to aid in synthesis of the magnetic semiconductor nanowires. The semiconductor-based solution may comprise any one of a number of different binary semiconductors (e.g., GaN, GaAs, GaP, ZnO, InAs, InP, BeO, CdS, HgS, etc.) or elemental semiconductors (e.g., Si, Ge) commonly known in the art. The dopant usually comprises a transition metal such as Mn, Ni, Co, Fe, Cr, etc.

In one mode of the invention, gallium (Ga) and manganese chloride ($MnCl_2$) are transported onto the substrate under flow of ammonia ($NH_3$) to synthesize the nanowires.

In another mode, the composition of the nanowires is controlled by controlling the amount of chloride-based vapor. In particular, the manganese concentration in the nanowires may be controlled by controlling the amount of chloride-based vapor.

In a preferred embodiment, the substrate the substrate is heated to a temperature in the range of 800° C. to 1000° C. prior to subjecting the substrate to gallium, manganese and chloride-based vapor.

In another embodiment, the gallium semiconductor is also transported via a chloride-based vapor. The transported GaCl3, MnCl2, and NH3 produce GaN:Mn crystalline phase nanowires through a reaction

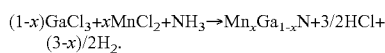

$$(1-x)GaCl_3 + xMnCl_2 + NH_3 \rightarrow Mn_xGa_{1-x}N + 3/2HCl + (3-x)/2H_2.$$

Preferably, single crystalline GaN:Mn nanowires are produced with no phase separation and the manganese dopant is homogeneously distributed on the nanowire.

Generally, the nanowires are ferromagnetic with a Curie temperature above 300 Kelvin, and have magnetoresistance at temperatures up to 250 K.

In preferred embodiments, the catalyst-coated substrate comprises nickel-coated silicon carbide (SiC) substrate. Alternatively, the substrate may comprise a nickel coated sapphire substrate.

In another aspect of the present invention, a diluted magnetic semiconductor (DMS) nanowire is produced by subjecting at least a portion of a catalyst-coated substrate to subjecting at least a portion of the substrate to a semiconductor-based solution and a dopant-based solution, wherein the dopant-based solution comprises a dopant and a chloride-based vapor transport. In a preferred embodiment, the DMS nanowire comprises a GaN:Mn nanowire. Generally, the nanowire has a length ranging from approximately 10 nm to 100 nm. The GaN:Mn nanowire is single crystalline with no phase separation, and may exhibit magnetoresistance up to 250K.

In yet another aspect of the invention, a method for synthesizing diluted magnetic semiconductor (DMS) nanowires comprises coating a substrate with a catalyst, heating the substrate to a temperature in the range of 800° C. to 1000° C., and transporting a semiconductor and a dopant to at least a portion of the substrate. The dopant is transported to the substrate via a chloride-based vapor to aid in synthesis of the magnetic semiconductor nanowires. In one mode, the semiconductor and dopant are both gaseous solutions.

In a further aspect of the invention, a method for fabricating GaN:Mn nanowires comprises providing a nickel-plated substrate, and transporting gallium and manganese metals via a chloride-based vapor onto the substrate to form GaN:Mn nanowires. The GaN:Mn nanowires are ferromagnetic and have a magnetoresistance. In a preferred mode of the present aspect, gallium chloride (GaCl3) and manganese chloride (MnCl2) are transported onto the substrate under flow of ammonia (NH3) to form the nanowires. The MnCl2 serves as a thermodynamically favorable transport agent for the formation of GaN:Mn nanowires as well as acting as a doping precursor.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

Figure 2A:
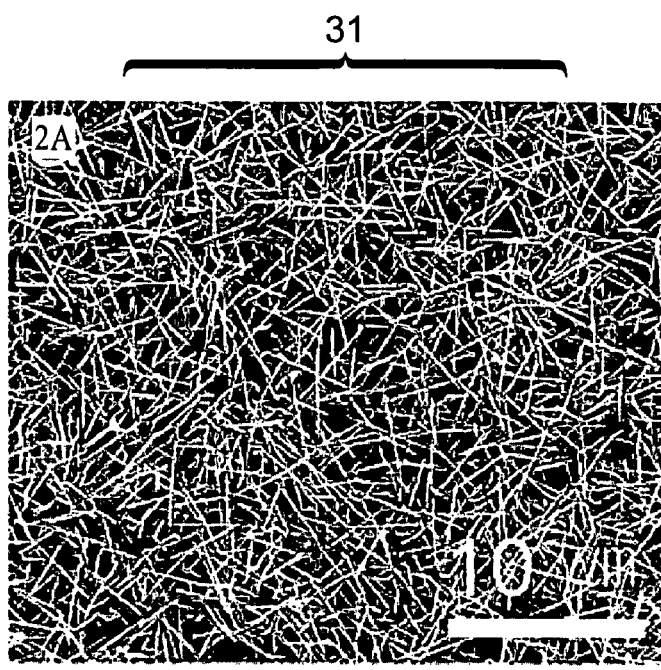
Figure 2B:
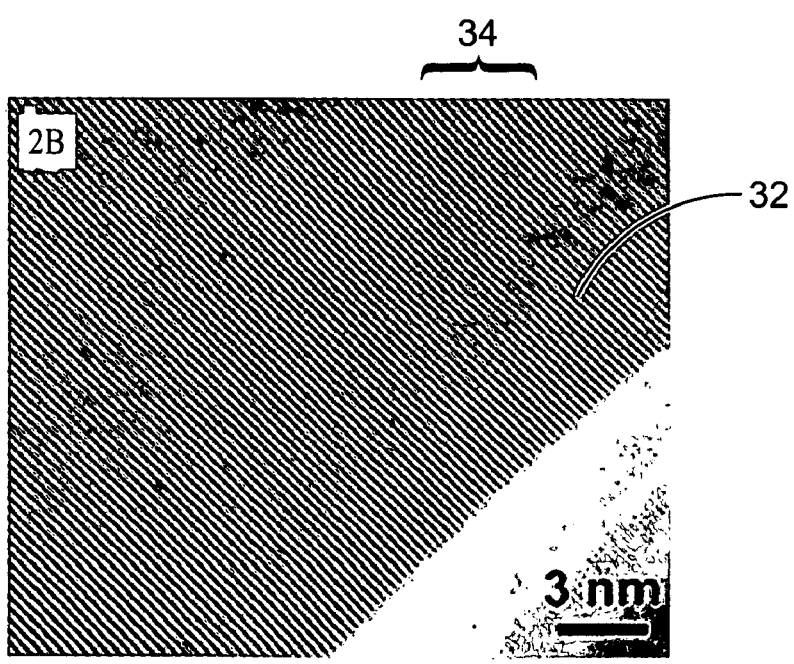
Figure 2C:
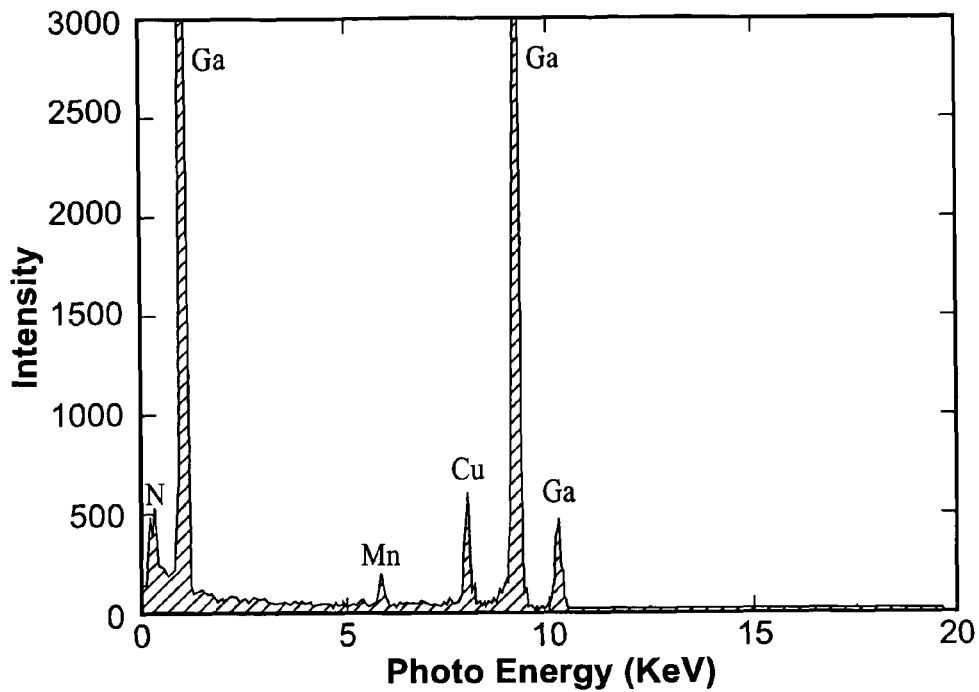
Figure 2D:
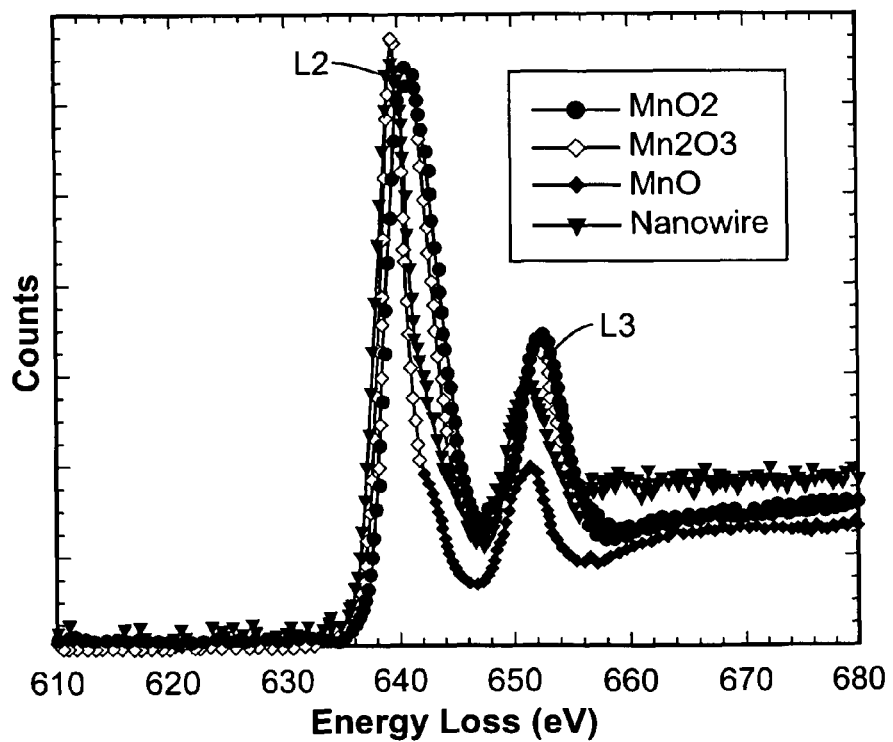

FIGS. 2A through 2D illustrate the structure and composition of GaN:Mn nanowires grown according to the present invention where FIG. 2A is a SEM image of the nanowires grown on a substrate, FIG. 2B is an HRTEM image of the nanowire, FIG. 2C is an EDS spectrum of the nanowire, and FIG. 2D illustrates a graph of the EELS spectra of the GaN:Mn nanowires collected together with the spectra collected from the standard reference samples: MnO, Mn2O3, MnO2.

Figure 3:
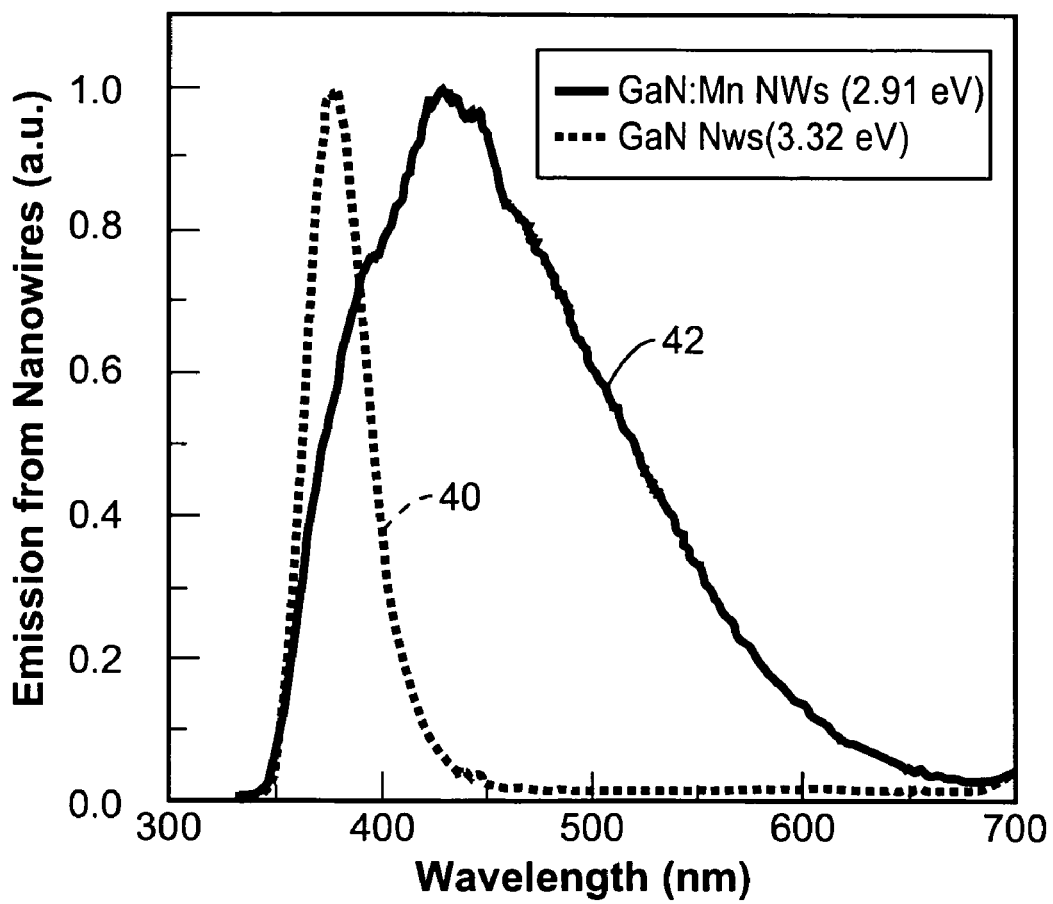

FIG. 3 is a graph showing the PL spectrum from GaN:Mn nanowires according to the present invention, recorded at 300 K.

Figure 4A:
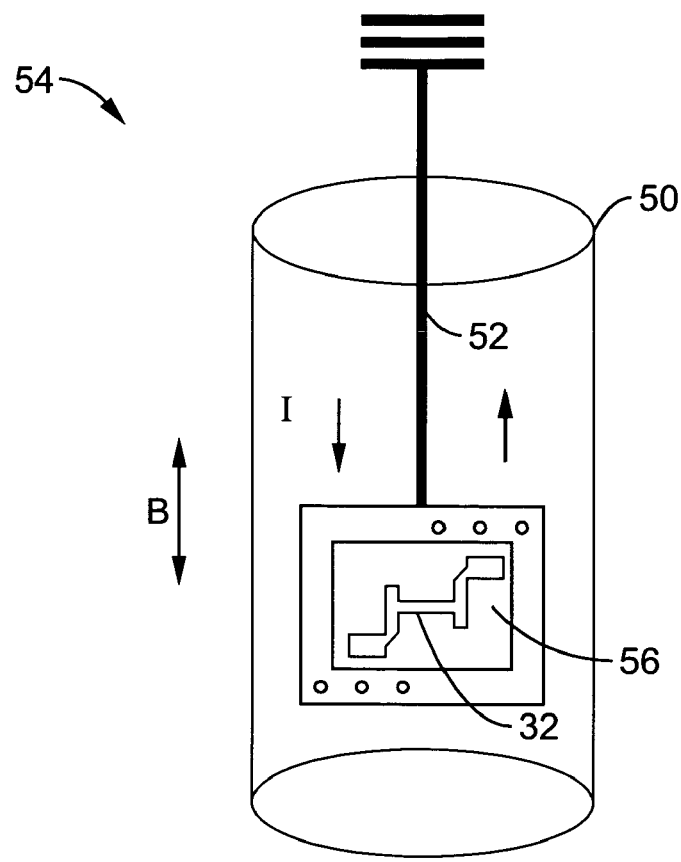
Figure 4B:
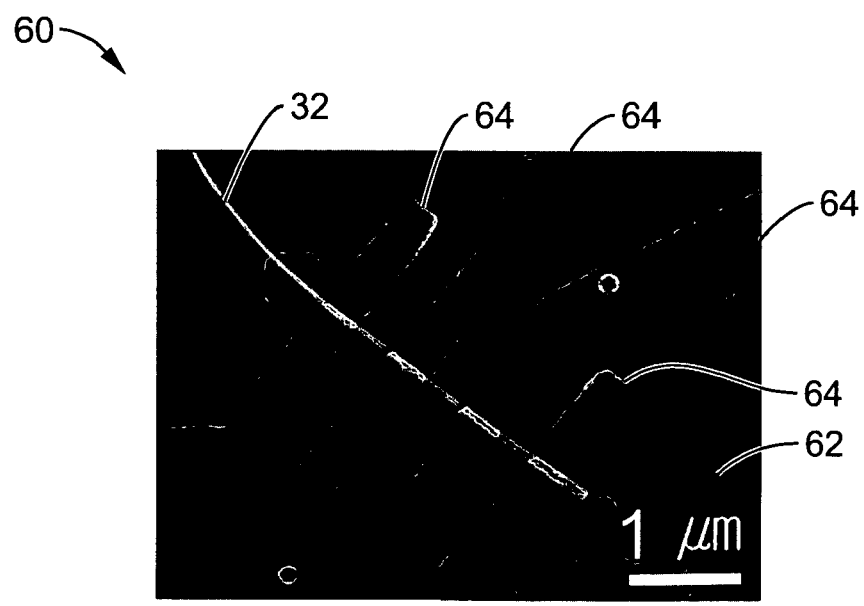
Figure 4C:
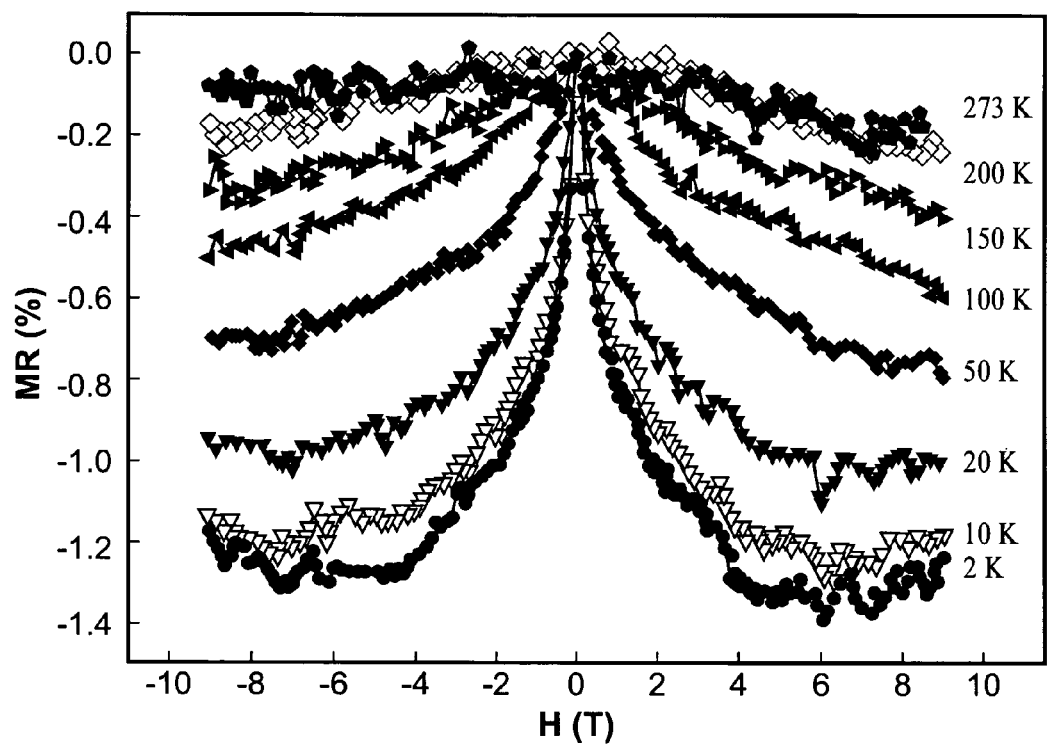

FIG. 4A is a schematic illustration of the magnetoresistance measurement set-up using SQUID magnetometry, FIG. 4B is an SEM image of the nanowire test substrate, and FIG. 4C is a graph of the magnetoresistance of a GaN:Mn nanowire at several different temperatures.

Figure 5A:
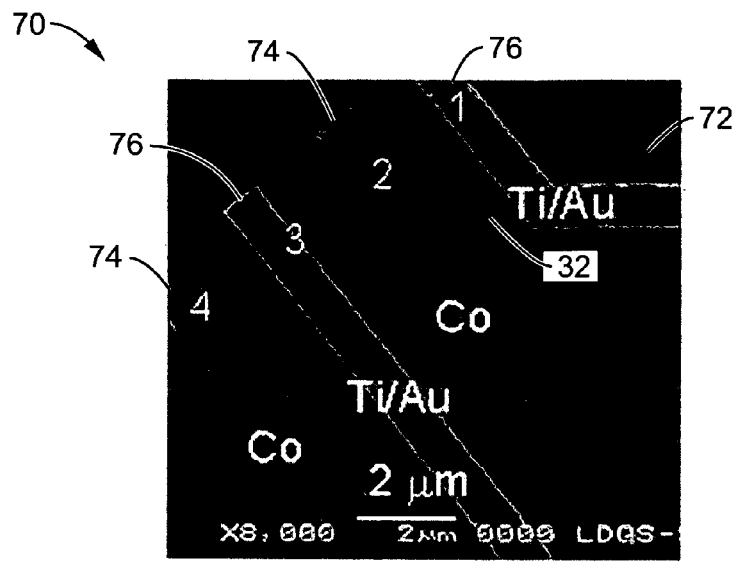

FIG. 5A is an SEM image of a GaN:Mn nanowire with two ohmic contacts Ti/Au (1 and 3) and two ferromagnetic Co electrodes (2 and 4).

Figure 5B:
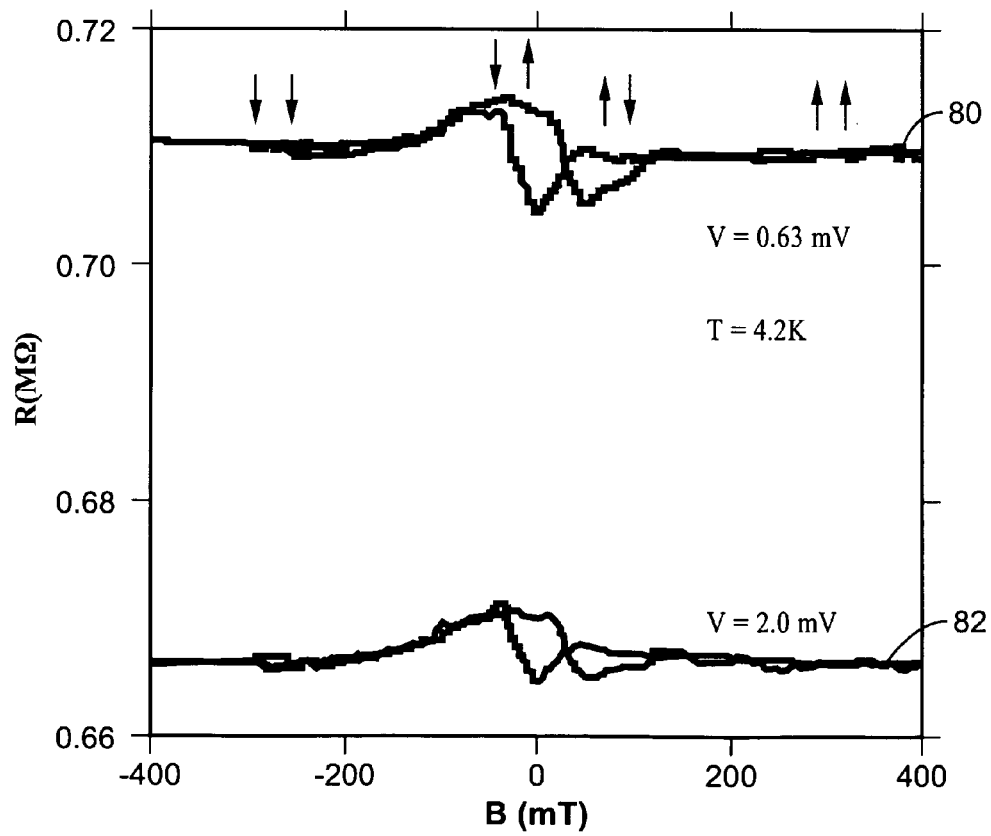

FIG. 5B is a graph illustrating the resistance change as a function of magnetic field between the electrodes 2 and 3 of FIG. 5A at 4.2 K with bias voltages of 0.63 and 2.0 mV.

Figure 6A:
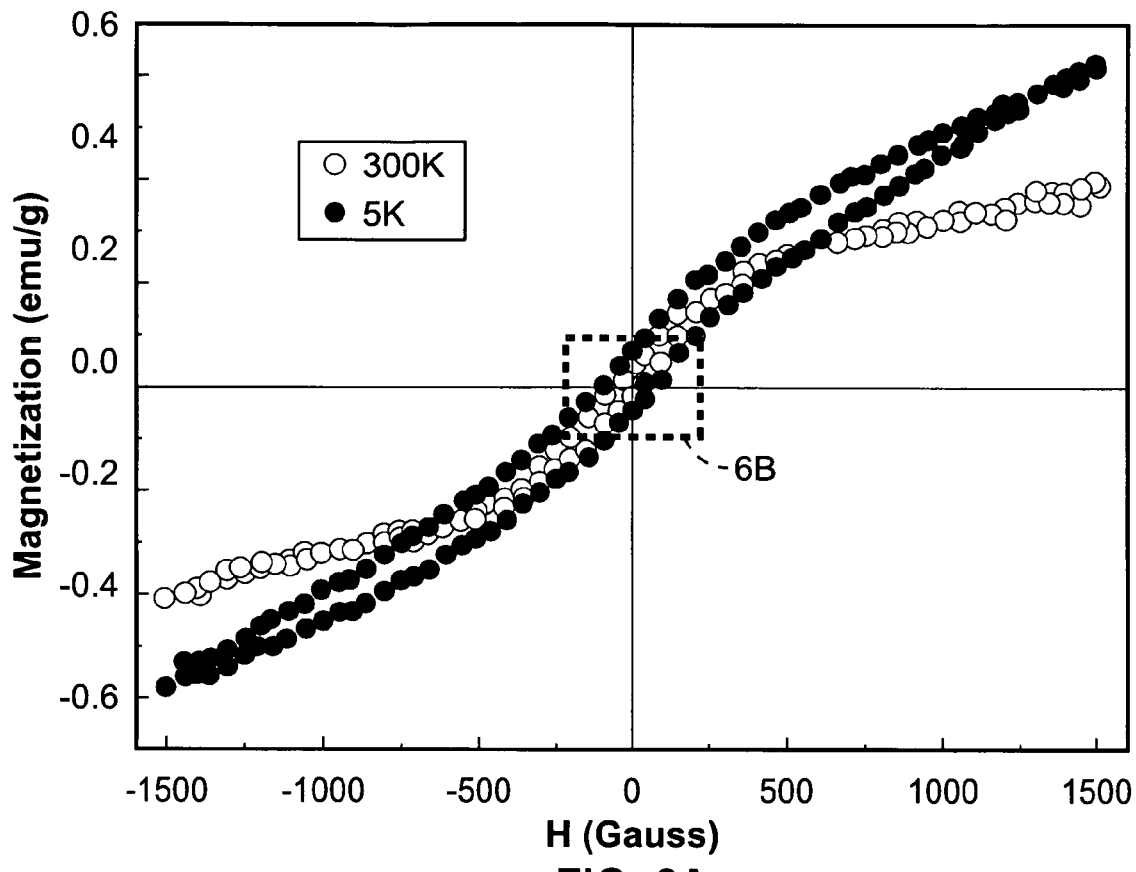
Figure 6B:
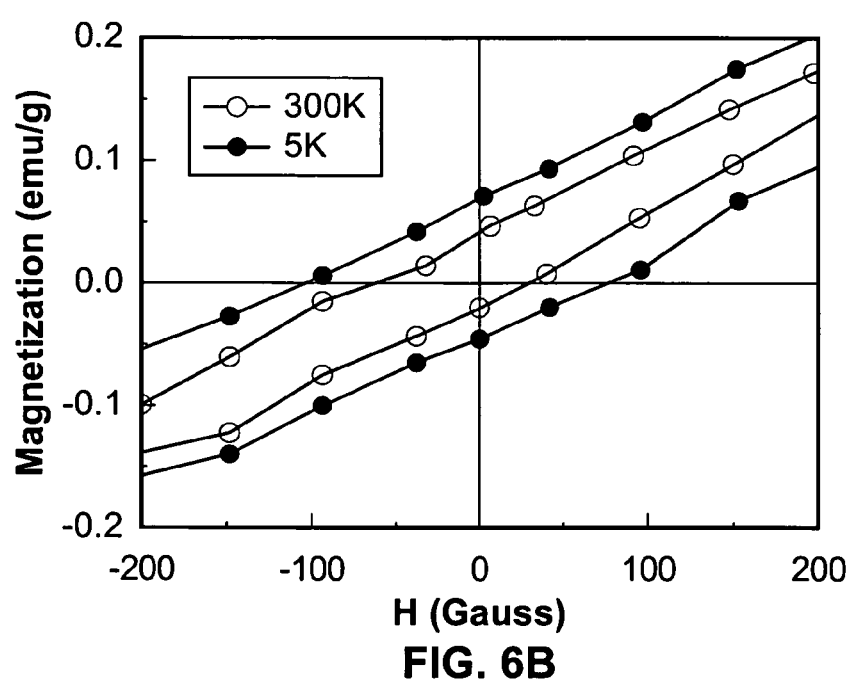
Figure 6C:
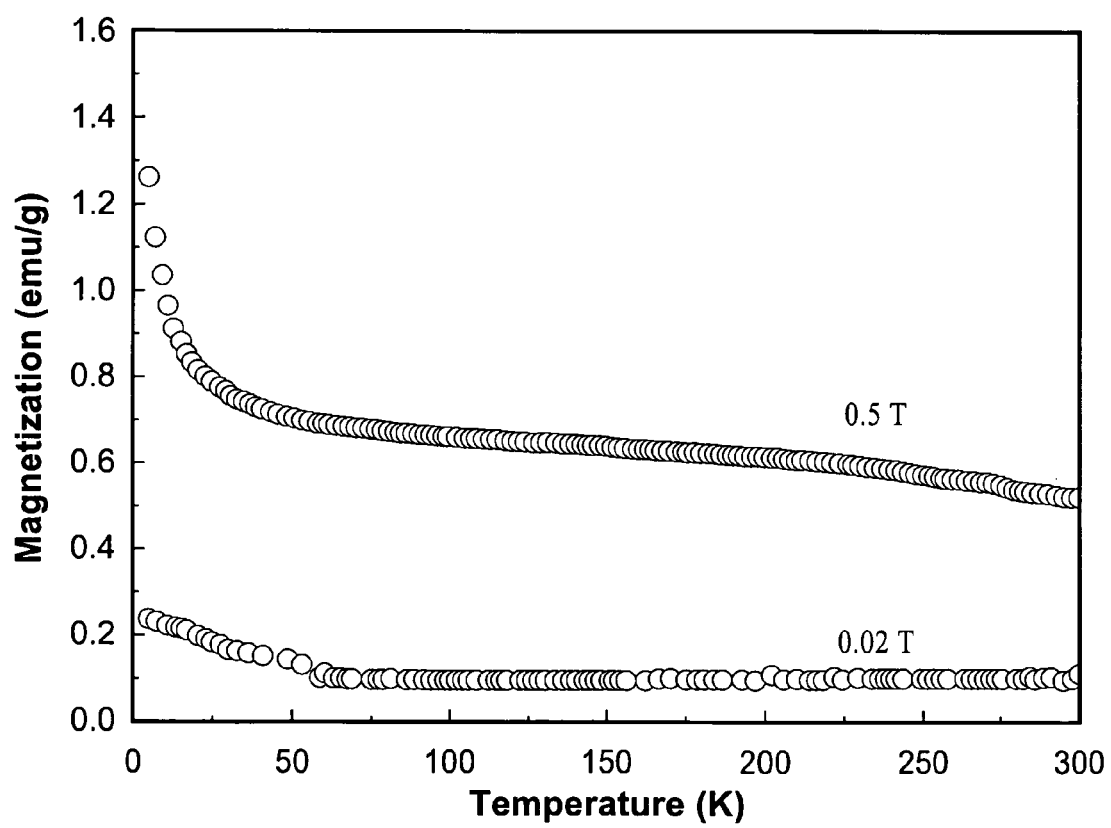
Figure 8A:
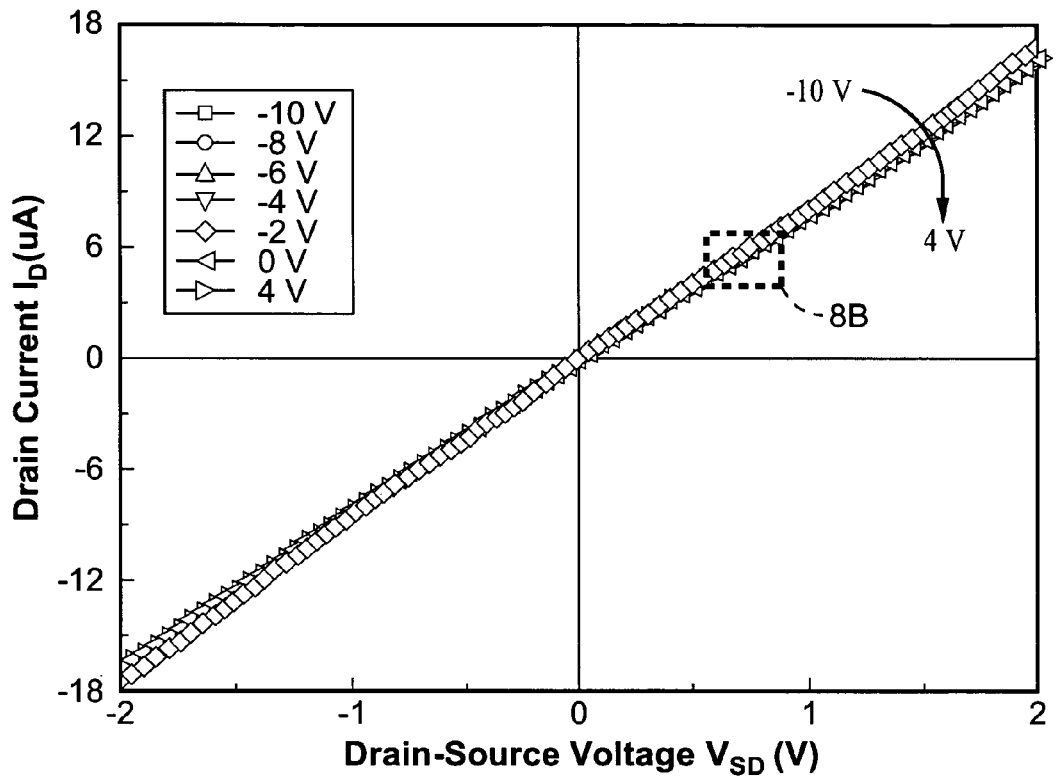
Figure 8B:
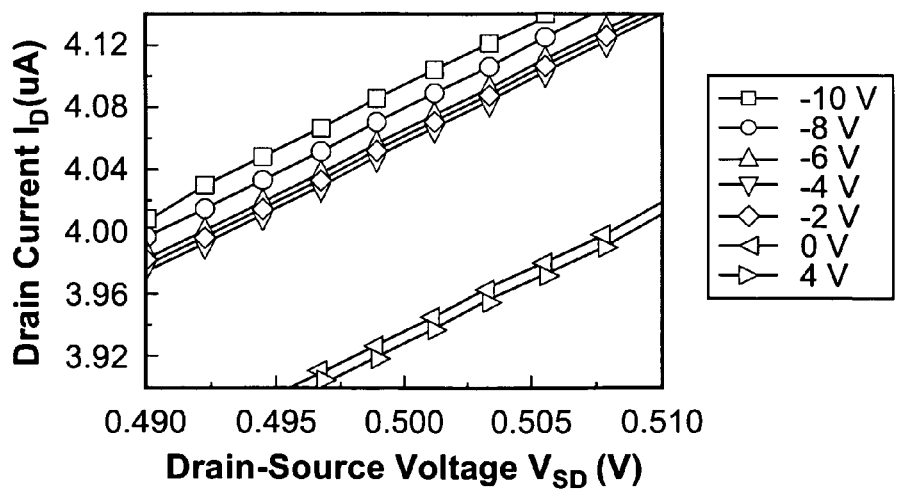

FIG. 6A-6C. are graphs showing the magnetic properties of GaN:Mn nanowires according to the present invention. FIG. 6A illustrates the magnetization loops of the nanowires measured at 5K and 300K, and FIG. 8B is an expanded view of a portion of the graph of FIG. 8A. FIG. 8C shows the temperature dependence of the magnetization.

Figure 7A:
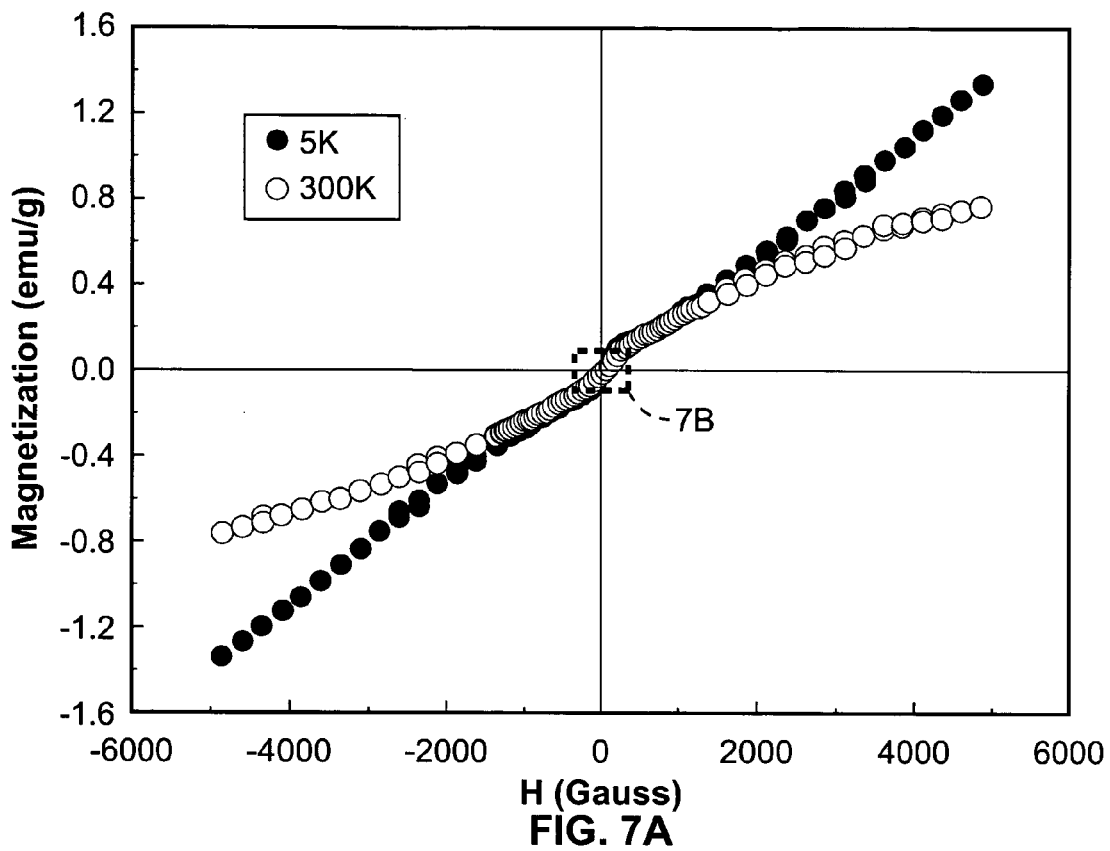
Figure 7B:
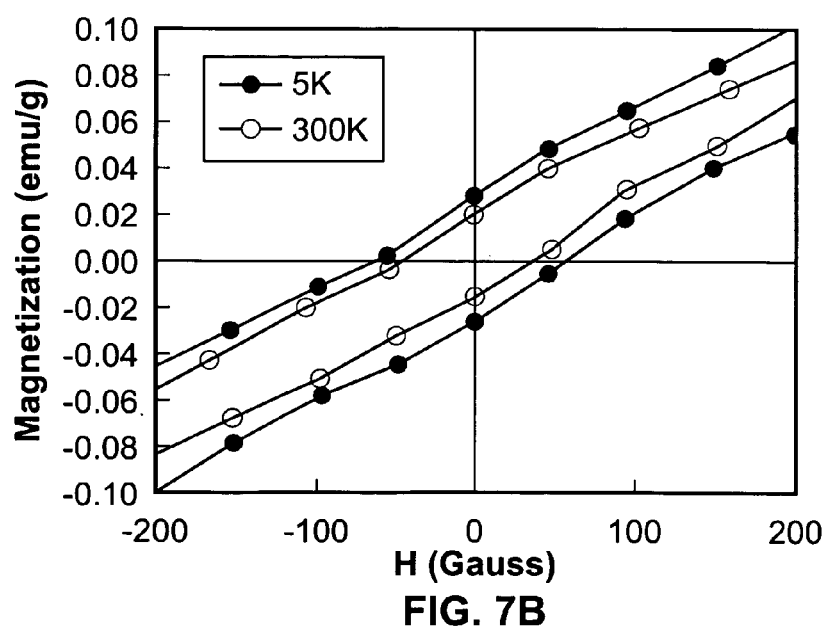
Figure 7C:
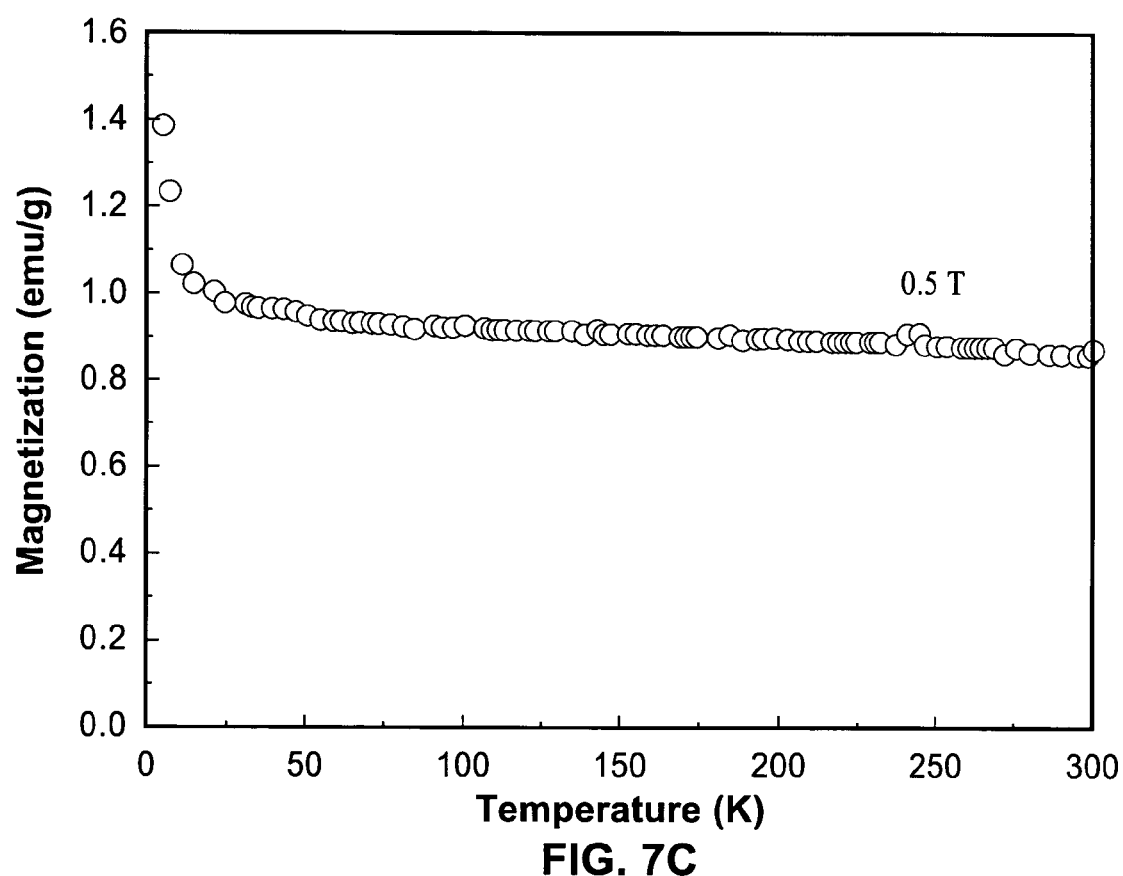

FIGS. 7A-C illustrate the magnetic properties of Ga:Mn nanowires treated with aqua regia. FIG. 7A illustrates the magnetization loops of the nanowires measured at 5K and 300K, and FIG. 7B is an expanded view of a portion of the graph of FIG. 7A. FIG. 7C shows the temperature dependence of the magnetization.

FIG. 8A is a graph of the current-voltage characteristics of Ga:Mn nanowires. FIG. 8B is an enlarged view of a portion of the graph of FIG. 8A.

Figure 9A:
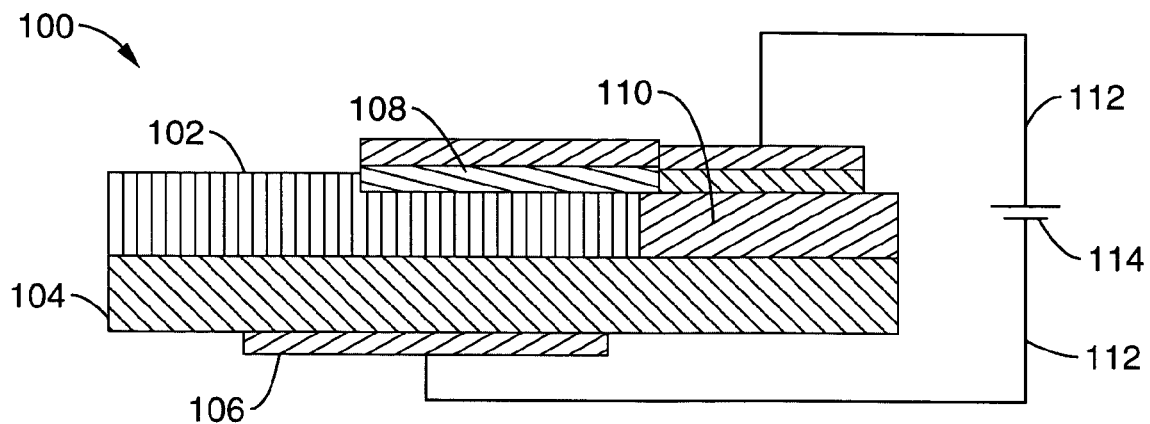

FIG. 9A is a schematic illustration of GaN:Mn nanowire LED structures in accordance with the present invention.

Figure 9B:
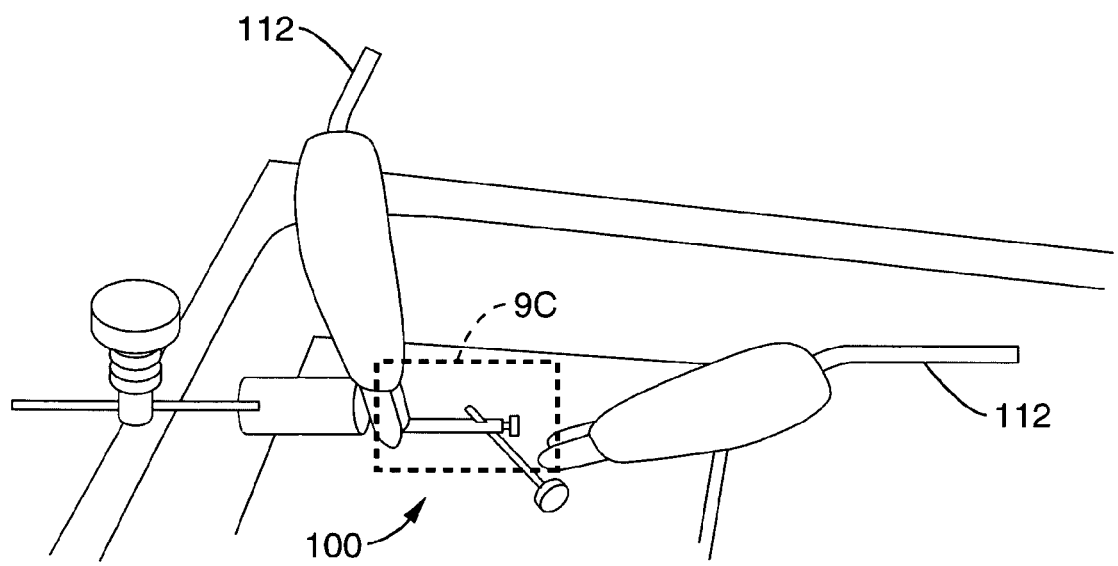
Figure 9C:
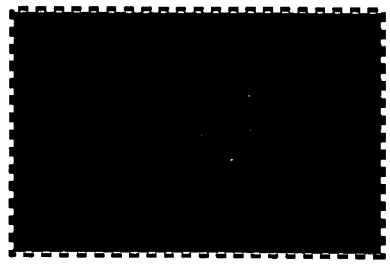

FIG. 9B is an image of a set up for carrying out measurements by probe contact on TaOx film and FIG. 9C is an image of light emission from the nanowire LED.

Figure 10A:
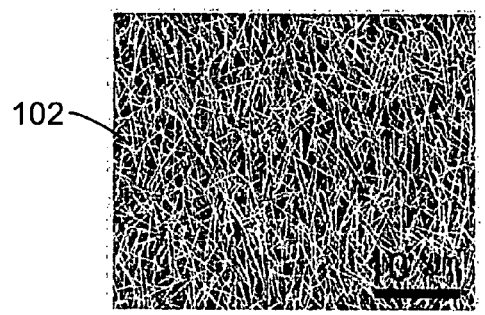

FIG. 10A is a SEM image of the quasi-vertical nanowire arrays on a substrate, and FIG. 10 B is a graph illustrating I-V behavior of n-SiC substrate/GaN:Mn nanowire junction. FIG. 10 C is a graph showing the electroluminescence spectrum from nanowire LED at 18 V of forward bias.

Figure 11A:
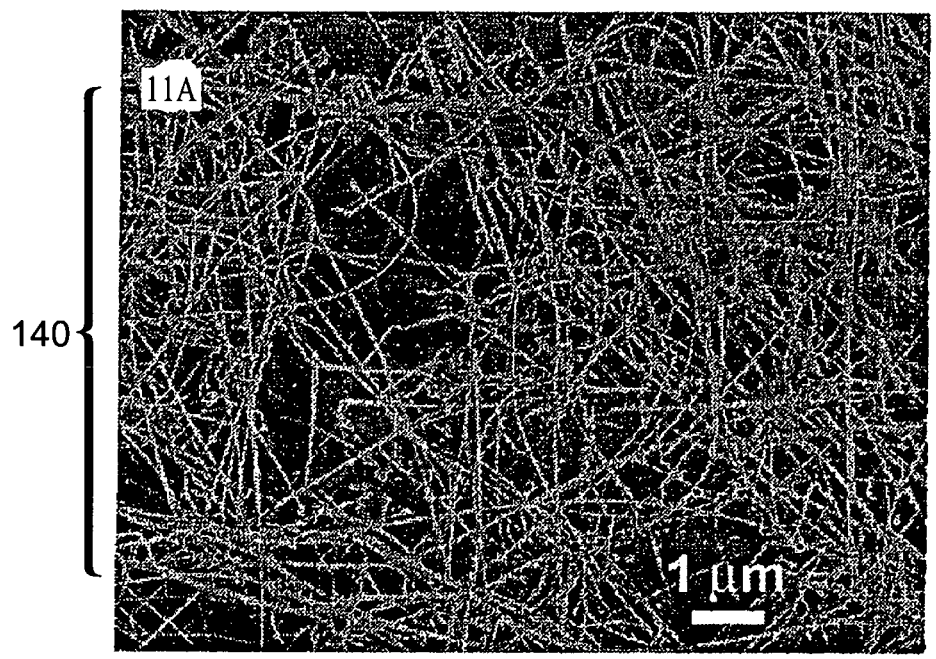
Figure 11B:
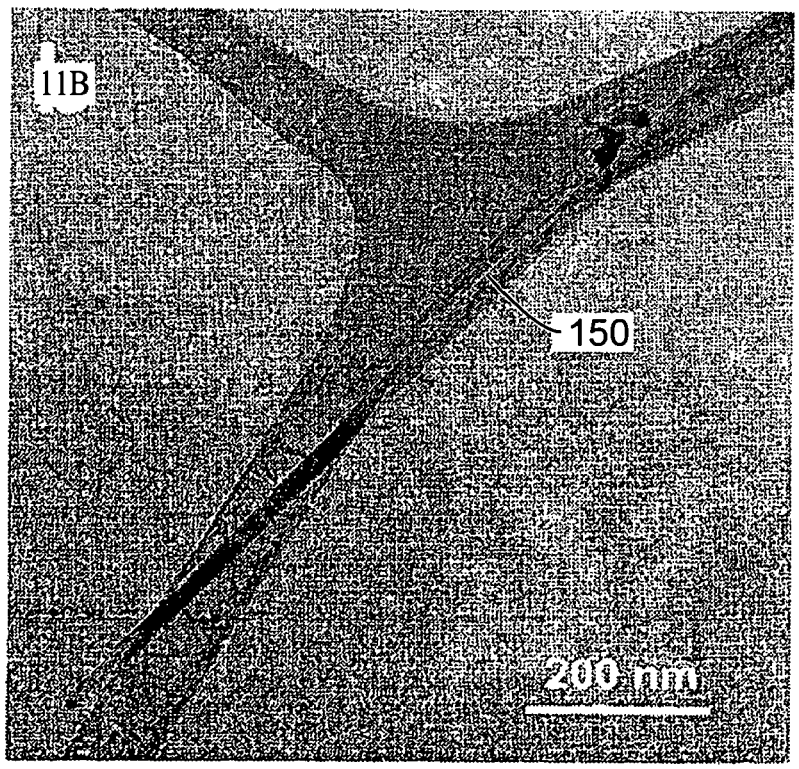
Figure 11C:
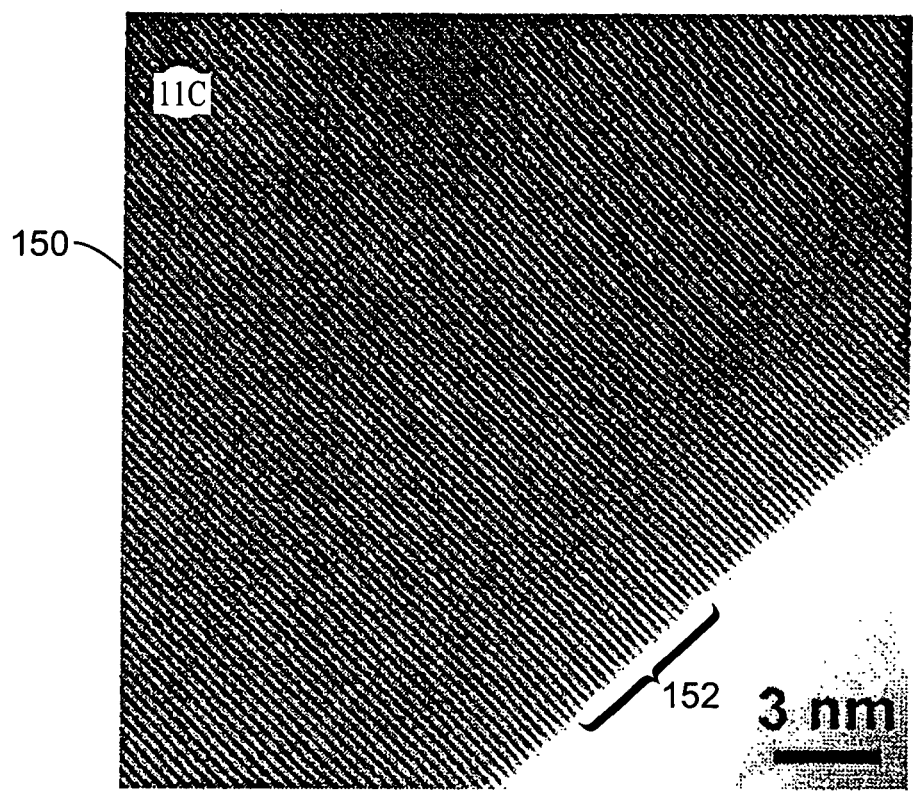
Figure 11D:
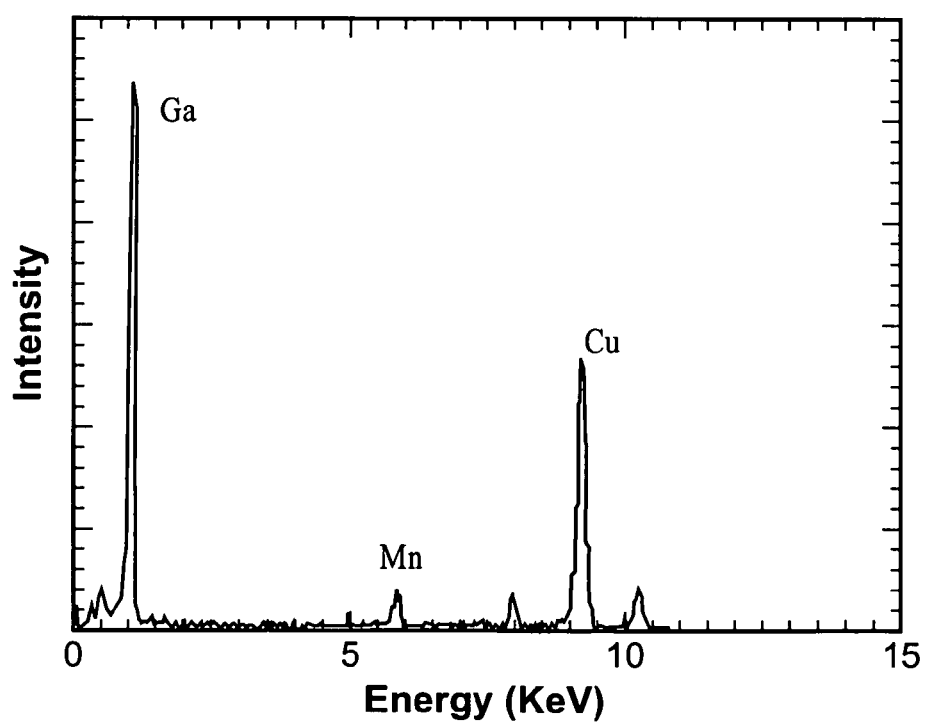

FIGS. 11A through 11D illustrate the structure and composition of GaN:Mn nanowires grown according to the present invention where FIG. 11A is a SEM image of the nanowires grown on a substrate, FIGS. 11B and 11C are HRTEM images of the nanowire, and FIG. 11D is a graph of the EDS spectrum of the nanowire.

Figure 12A:
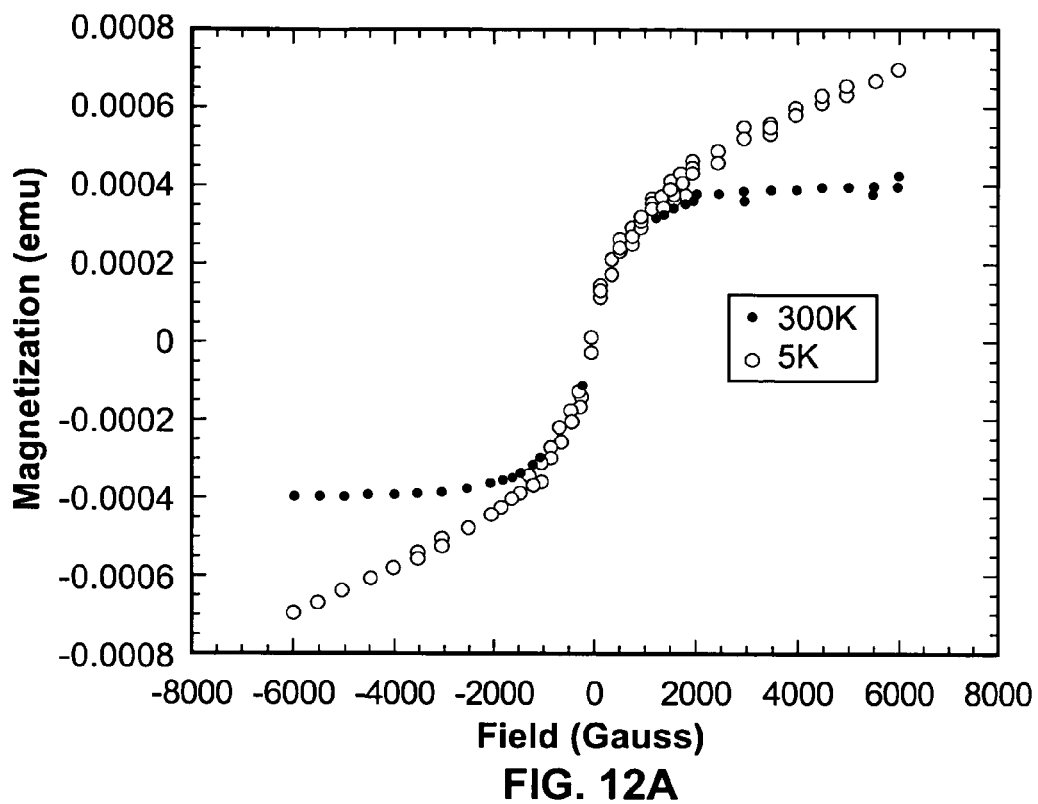
Figure 12B:
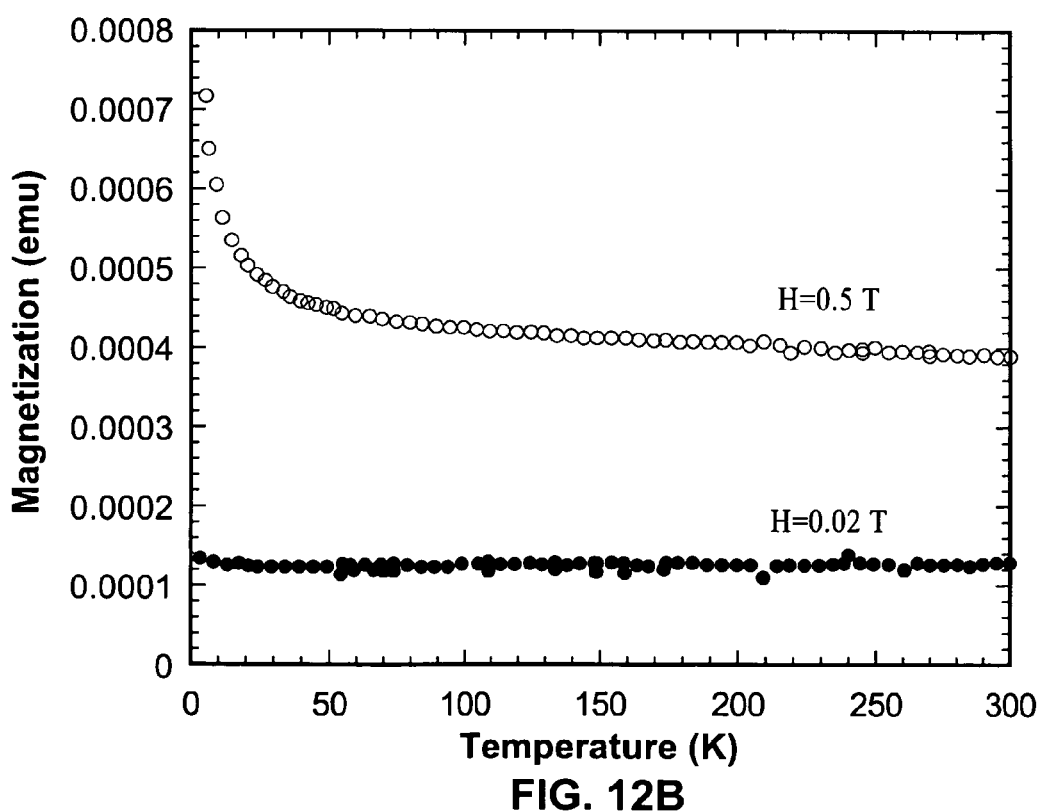

FIGS. 12A and 12B are graphs showing the magnetic properties of GaN:Mn nanowires according to the present invention, where FIG. 2A shows the magnetization loops of the nanowires measured at 5K and 300K, and FIG. 12B shows the temperature dependence of the magnetization.

Figure 13:
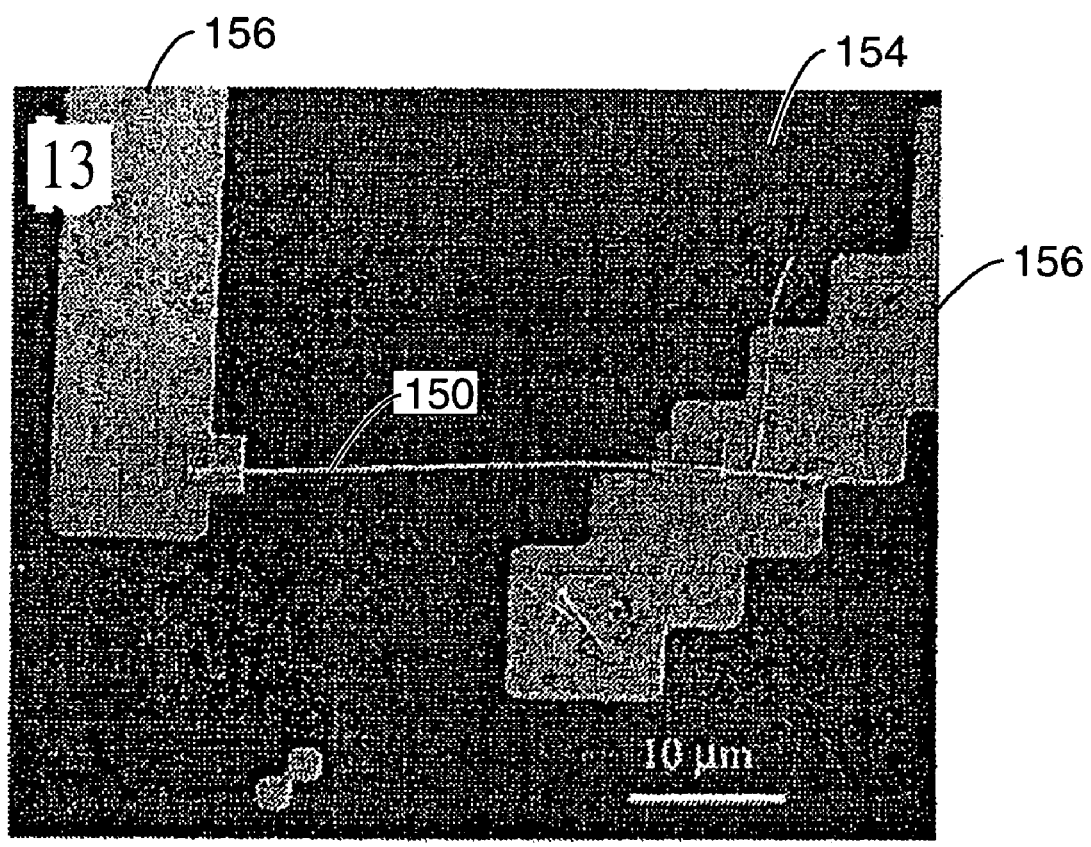

FIG. 13 is an SEM image of the nanowire test device.

Figure 14:
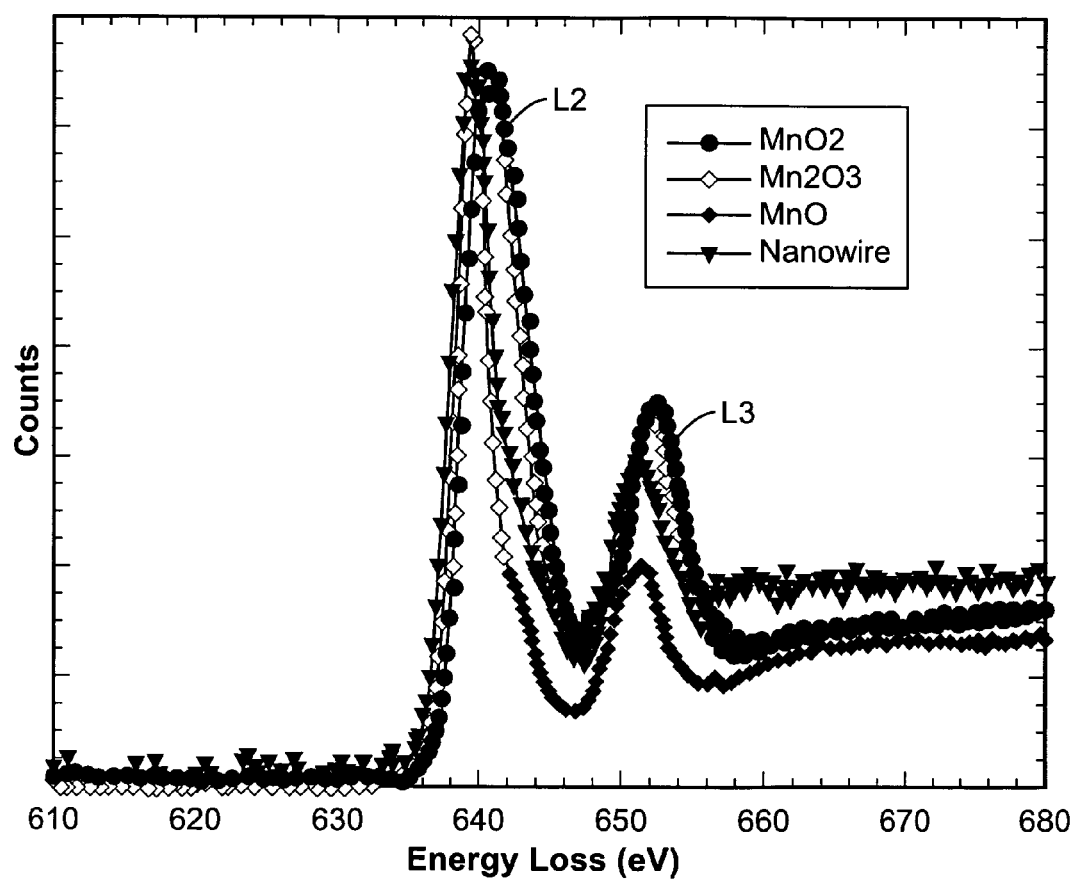

FIG. 14 is a graph showing the EELS spectra of the GaN:Mn nanowires plotted together with the spectra collected from the standard reference samples.

Figure 15:
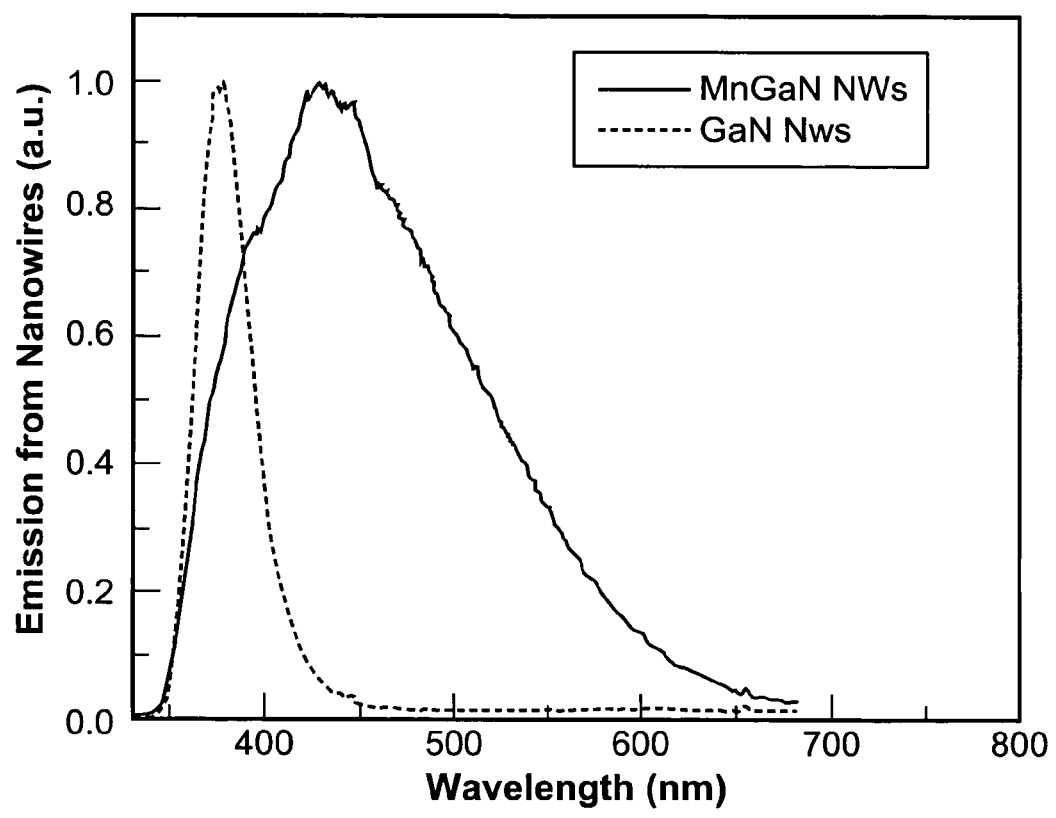

FIG. 15 is a graph showing the PL spectrum from GaN:Mn nanowires according to the present invention, recorded at 300 K.

Figure 16A:
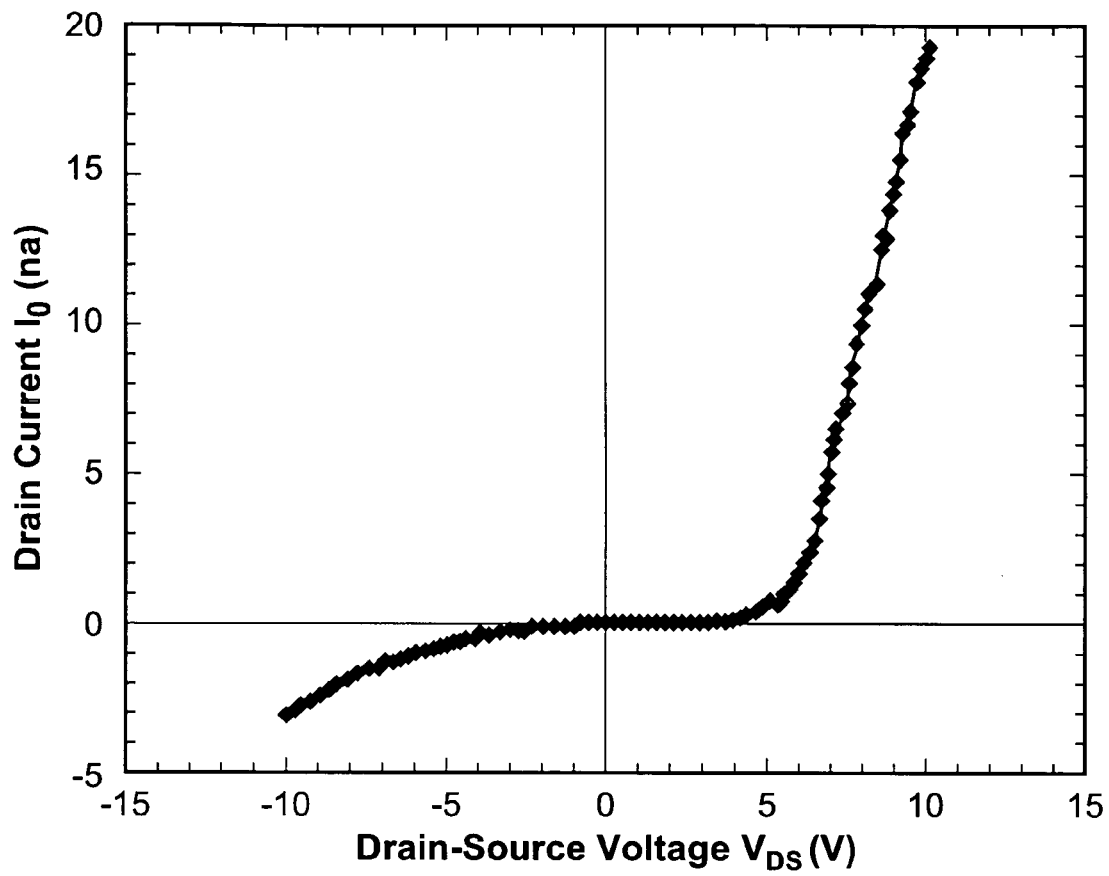
Figure 16B:
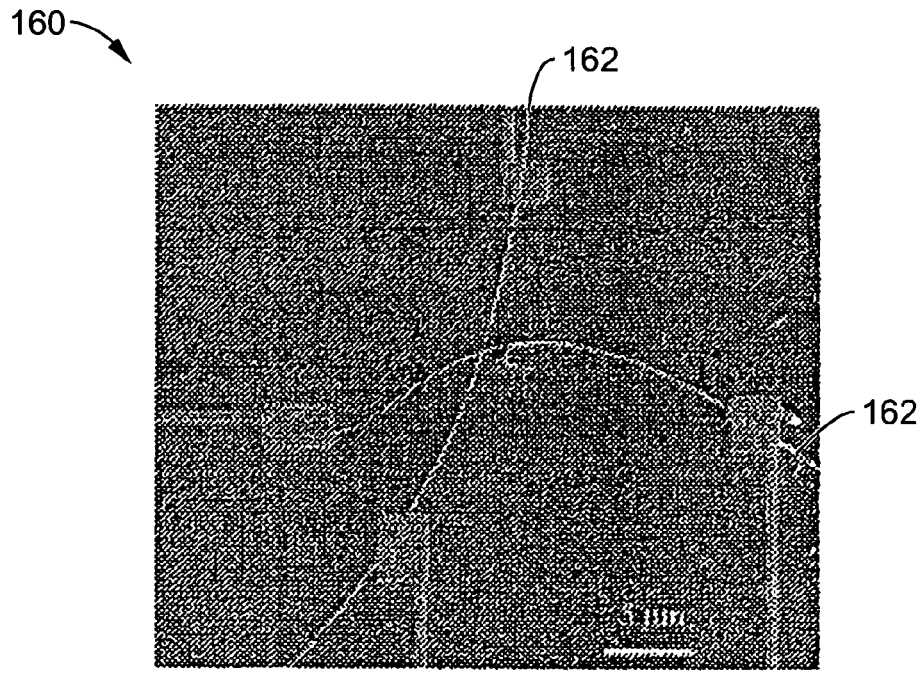

FIG. 16A illustrates the I-V behavior of a silicon doped GaN/GaN:Mn junction according to the present invention wherein FIG. 16B is an SEM image of the crossed n-GaN/GaN:Mn nanowire junction and the scale bar=5 μm.

DETAILED DESCRIPTION OF THE INVENTION

Referring more specifically to the drawings, for illustrative purposes the present invention is embodied in the apparatus generally shown in FIG. 1A through FIG. 16B. It will be appreciated that the apparatus may vary as to configuration and as to details of the parts, and that the method may vary as to the specific steps and sequence, without departing from the basic concepts as disclosed herein.

Example 1

As opposed to existing transition metal-doped DMSs prepared by non equilibrium MBE processes (which are fabricated at low temperature to suppress the formation of the second phase), the diluted magnetic semiconductor nanowires of the present invention are fabricated by an equilibrium vapor transport process at high temperature. The presence of chloride transport (e.g., HCl) is instrumental in the results achieved by the process of the present invention. For a GaN:Mn nanowire, transported $GaCl_3$, $MnCl_2$ and $NH_3$ produce GaN:Mn crystalline phase through the following reaction:

$$(1-x)GaCl_3 + xMnCl_2 + NH_3 \rightarrow Mn_xGa_{1-x}N + 3/2 HCl + (3-x)/2 H_2.$$

In this reaction, $GaCl_3$ and $MnCl_2$ serves as a thermodynamically favorable transport agent for the formation of a single GaN:Mn phase. Importantly, this process produces single crystalline GaN:Mn nanowires with absolutely no phase separation and gain boundaries, which have been a common problem for most of the GaN:Mn thin film studies.

Figure 1A:
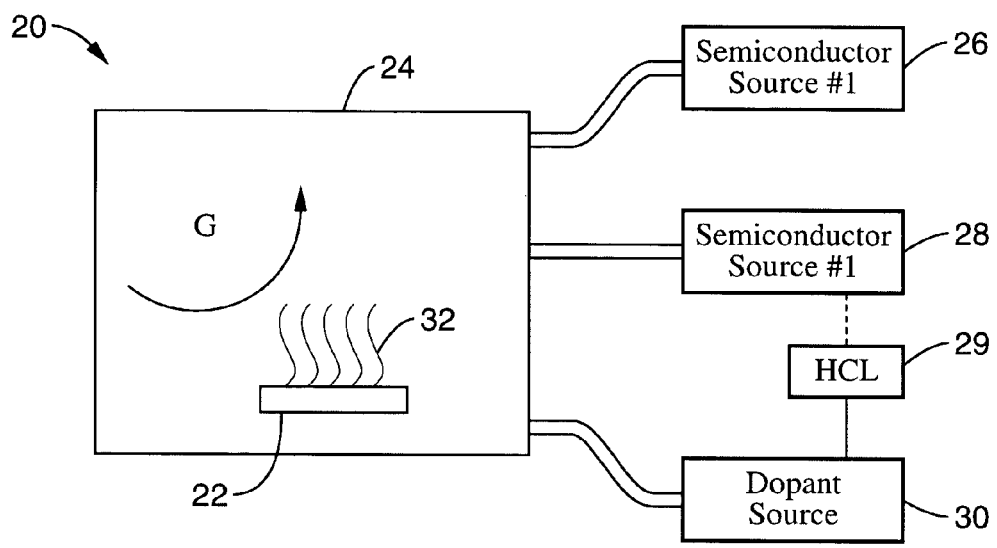
FIG. 1A illustrates an exemplary diluted magnetic semiconductor fabrication assembly for a binary semiconductor composition nanowire in accordance with the present invention.

FIG. 1A illustrates an exemplary diluted magnetic semiconductor fabrication assembly 20 for synthesizing a binary semiconductor composition nanowire in accordance with the present invention. A substrate 22 is first coated with catalyst, such as nickel, gold, cobalt or iron. The substrate 22 may comprise sapphire (for isolative properties, silicon carbide (SiC) (for conductive properties), or similar materials known in the art.

After deposition of the catalyst (nickel), the substrate 22 is placed in growth chamber 24 and then heated from 800° C. to 1000° C., and preferably to between 800° C. and 900° C. Generally, nanowire growth 32 will occur at a temperature at a range of 800° C. and 1000° C. For a binary semiconductor, gaseous solution G is circulated in chamber 24 via first semiconductor source 26, second semiconductor source 28 and dopant source 30. The dopant solution is transported to the substrate 22 via a chloride-based vapor such as HCL 29. The concentration of dopant may and composition of the nanowires 32 can therefore be controlled by the amount of HCl gas input 29. Optimally, the dopant comprises a transition metal such as Mn, Ni, Co, Fe, Cr, etc.

The semiconductor-based solution may comprise any one of a number of different binary semiconductors (e.g., GaN, GaAs, GaP, ZnO, InAs, InP, BeO, CdS, HgS, etc.) commonly known in the art. Thus, for a GaAs nanowire, the first semiconductor source 26 will have an arsenic (As)-based gas such as hydrogen arsenide ($ArH_3$). Correspondingly, second semiconductor source 28 will comprise gallium (Ga). The gallium may also have a chloride-based transport fed by HCL source 29 to make gallium chloride ($GaCl_3$).

For GaN:Mn nanowires, gallium chloride ($GaCl_3$) and manganese chloride ($MnCl_2$) are transported onto the substrate under flow of ammonia ($NH_3$) (to provide nitrogen) at 800° C. To control the Mn concentration in the nanowires, the $GaCl_3$ and $MnCl_2$ are transported by using metallic Ga, Mn and hydrogen chloride (HCl) gas. Temperature and vapor input are maintained until the desired nanowire growth is achieved, usually a few minutes to an hour, depending on the nanowire length.

Figure 1B:
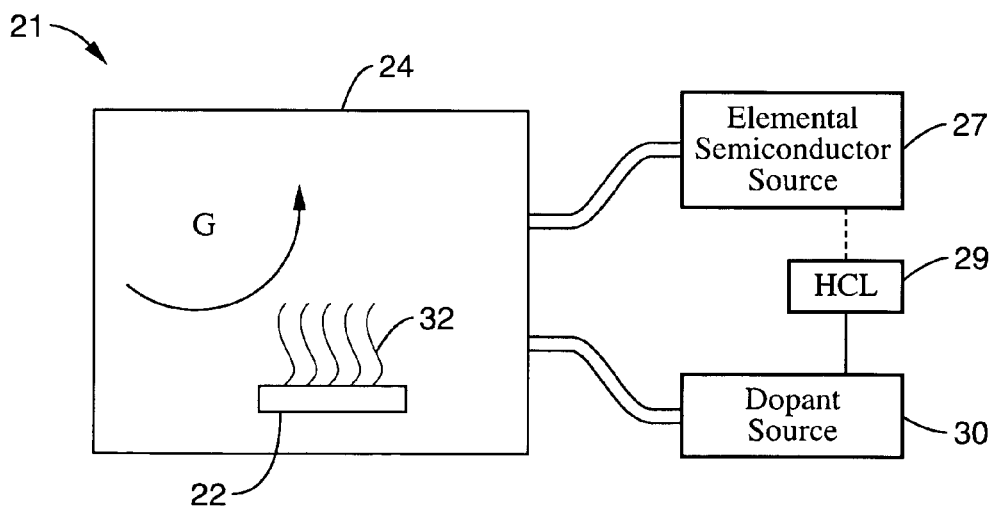
FIG. 1B illustrates an exemplary diluted magnetic semiconductor fabrication assembly for an elemental semiconductor composition nanowire in accordance with the present invention.

FIG. 1B illustrates an exemplary diluted magnetic semiconductor fabrication assembly 21 for synthesizing an elemental semiconductor composition nanowire in accordance with the present invention. Elemental semiconductors (e.g., Si, Ge) are fed into the chamber 24 via elemental semiconductor source 27. HCL source 29 is used to transport the dopant via dopant source 30. Optionally, HCL 29 may be used to transport the elemental semiconductor, e.g., to make silicon tetrachloride ($SiCl_4$).

FIG. 2A shows a typical scanning electron microscopy (SEM) image of the nanowires 31 grown on the substrate. The diameter and length of these nanowires are between 10-100 nm and tens of micrometers, respectively. FIG. 2B shows a high resolution transmission electron microscopy (HRTEM) image of an individual nanowire 32. Perfect single-crystalline nature, without defects or second phase inclusion, can be readily seen from the HRTEM image of FIG. 2b. A selected area electron diffraction (SAED) pattern 34 recorded on the wire and indexed according to the wurtzite GaN structure further confirmed single-phase nature of these nanowires. Differences in the structural characteristics of $Ga_{1-x}Mn_xN$ nanowires were not observed in XRD and TEM analysis for x=0-0.09.

FIG. 2C shows the representative Mn concentration determined by the energy dispersive X-ray spectroscopy (EDS) analysis on the $Ga_{0.93}Mn_{0.07}N$ nanowires. The average Mn concentration measured from ten nanowires was 7% and Mn dopant was found to distribute homogeneously within the nanowire lattice.

FIG. 2D illustrates a graph of an electron energy loss spectroscopy (EELS) analysis of the valence state of the Mn dopant in GaN carried out on spectra acquired from standard reference specimens having known cation oxidation states: MnO, $Mn_2O_3$ and $MnO_2$. EELS has been widely used for microanalysis of materials composition, as it has been well documented that the EELS spectra of the transition metal is highly sensitive to the oxidation states of the metal. Comparison of the shape and relative intensity ratios of the L3 and L2 lines shown in FIG. 2D unambiguously shows that the Mn dopants exist as $Mn^{2+}$ cations (having a $d^5$ electron configuration) within the GaN matrix. Consequently, it is likely that $Mn^{2+}$ exists as ionized acceptors within the GaN:Mn nanowires 32 produced at high temperature.

This finding is further confirmed by photoluminescence (PL) studies on the GaN:Mn nanowires 32. FIG. 3 is a graph of the PL spectrum of GaN:Mn nanowires compared to pure GaN nanowires of similar size at 300K. An He—Cd CW laser was used as an excitation source. The PL spectrum shows the appearance of broad emission at 2.5-3.2 eV, which matches well with previous GaN:Mn thin film studies, wherein Mn also exists as $Mn^{2+}$. The GaN:Mn nanowires spectrum 40 can be clearly distinguished from the pure GaN nanowire spectrum 42 in FIG. 3.

Referring now to FIG. 4A, the magnetic properties of the nanowires were determined using superconducting quantum interference device (SQUID) magnetometer 50. Test structure 54 having a nanowire 32 disposed on substrate 54 was inserted in SQUID magnetometer 50 via insertion tool 52.

FIG. 4B illustrates an exemplary four-probe test structure 60 for MR measurement: To fabricate test structure 60, coordinate marks were patterned on a thermally oxidized Si (100) substrate by using an electron beam lithography followed by metal deposition (Ti/Au, 20/40 nm) by a DC magnetron sputtering system and a lift-off process. A nanowire solution was dropped onto a pre-patterned Si substrate and the location of each nanowire relative to the patterned marks was estimated by atomic force microscope images. Four electrodes 64 were defined using e-beam lithography to touching nanowire 32. An Au layer (40 nm) was deposited on the electrodes 64 and lift-off process was used to produce finalize the test structure.

MR measurements were carried out with PPMS (Physical Property Measurement System) by applying an external magnetic field up to 9 Tesla in the temperature range 2-300 K. FIG. 4C shows the isothermal MR of an individual nanowire 32 fabricated in accordance with the present invention, as measured on four-probe test structure 60. As can be seen in FIG. 4C, the GaN:Mn nanowire exhibits negative magnetoresistance (MR) up to 250K Negative MR (resistance decreases with applied magnetic field) with a value of 1.4% and 0.4% at 2 K and 250 K, respectively, in 9 T. The MR diminishes near room temperature. This type of negative MR has also been observed in (Ga, Mn)As and (Ga, Mn)N epitaxial thin films [9-16]. Such a negative MR can be explained by the reduction of scattering by aligning the spins by applied magnetic field. In contrast, MR measurements of pure GaN nanowires at similar temperature and field range show no sign of magnetoresistance.

The ferromagnetism nature of the nanowires can be further confirmed by the spin-dependent electron transport measurement in individual nanowires using ferromagnetic electrodes. FIG. 5A shows an SEM image of a nanowire-based tunneling magnetoresistance test structure 70 used to study spin-dependent transport. An individual nanowire 32 in accordance with the method of the present invention was positioned on an oxidized Si substrate 72. Nanowire 32 spans across ferromagnetic Co electrodes 74 (2 and 4) and Ti/Au electrodes 76 (1 and 3).

The patterns for electrical leads were generated by using electron beam lithography onto the selected substrate. A metal layer (Ti/Au, 20/50 nm) was deposited successively on the contact area by thermal evaporation. Ohmic contacts between the nanowire and the Ti/Au electrodes were achieved by the optimum annealing process. After establishing the ohmic contacts, ferromagnetic Co metal was deposited onto the pre-patterned substrate to form magnetic tunnel barrier junction by thermal evaporation.

FIG. 5B shows the resistance measured between ferromagnetic Co electrode (2) and Ti/Au electrode (3) through GaN: Mn nanowire with two different bias voltages of 0.63 mV (80) and 2 mV (82) at 4.2 K. The results show clear hysteresis behaviors, which are commonly observed in tunneling magneto-resistance devices. The I-V characteristics at 4.2 K show non-linear behavior, which implies the formation of tunnel barrier between the electrodes and nanowire. The typical resistance in linear region is about 440 k$\Omega$ at 4.2K and the resistance change, $\Delta R$ is about 9 k$\Omega$ at a bias voltage of 0.6 mV, which gives the MR change, $\Delta R/R=1.3\%$. This hysteresis MR was observed up to about 20K. The resistance of a nanowire with two different metal contacts can be expressed by the equation:

$$R = R_{Co/NW} + R_{NW} + R_{NW/Ti} + R_{Co}$$

where $R_{Co}$ and $R_{NW}$ are the resistance of Co electrode and nanowire, respectively, while $R_{Co/NW}$ and $R_{NW/Ti}$ are the tunnel resistances from Co/nanowire and Ti/nanowire contacts. Among those resistances, $R_{Co/NW}$, $R_{Co}$, and $R_{NW}$ are the possible origins for the hysteretic MR. $R_{Co}$, however, has a resistance below 100$\Omega$, insufficient to explain the magnitude of the MR change (tens of k$\Omega$). It was also confirmed that $R_{NW}$ itself did not contribute to the hysteretic MR, with control experiments using nonmagnetic Ti contacts to the nanowire. As a result, the contributions from magnetic contact between Co and nanowire ($R_{Co/NW}$) are believed to cause the observed hysteretic MR.

FIG. 6A, and FIG. 6B illustrating an enlarged view of a portion of the graph of FIG. 6A, show magnetization loops of a $Ga_{0.93}Mn_{0.07}N$ nanowire sample detected under the SQUID setup of FIG. 4A. The magnetic hysteresis and remanence were clearly observed at 5 K and 300 K respectively, indicating the GaN:Mn nanowire is ferromagnetic even at room temperature. This is also reflected in the temperature dependent magnetization data collected at 0.02 and 0.5 T, as shown in FIG. 2C.

As illustrated in the magnetization loops of nanowires fabricated in accordance with the present invention measured at 5 k and 300 k in FIGS. 7A and 7B, aqua regia treatment of the nanowires also showed no effect on the magnetic properties. The Curie Temperature ($T_C$) is estimated to be above 300K. The theoretical model of hole-mediated ferromagnetism could explain the high $T_C$ observed in GaN:Mn phases. However, high hole and Mn concentration (e.g., 3.5× $10^{20}$ cm$^{-3}$ and 5%, respectively) are required for such a high $T_C$.

To determine the type and concentration of carrier, nanowire field effect transistor (FET) structures were prepared by using GaN:Mn nanowires fabricated in accordance with the present invention. The nanowires were positioned on a test substrate comprising a silicon wafer with a 100 nm-thick thermally grown $SiO_2$ layer. An isopropyl alcohol (IPA) solution containing GaN:Mn nanowires were prepared and drop-cast onto a pre-patterned Si substrate. After drying, the location of nanowire was identified the source and drain electrodes were defined by lithography for nanowire-based field effect transistor (FET) structures. Prior to the metal electrode deposition (Ni/Au, 20/50 nm) by thermal evaporation, the nanowires were treated in buffered HF (10:1). Ohmic contacts between the nanowire and the electrodes were achieved by the optimum annealing process. The highly conductive Si layer was used as a global back gate.

Referring now to FIGS. 8A and 8B, current-voltage (I-V) curves for different back gating voltages from the nanowire-based FET structure were measured. The linear I-V curves suggest that the metal electrical contacts for the device with Ni/Au electrodes are ohmic. A weak gating effect, i.e., a conductivity decrease with positively increasing gate voltage, is observed. This suggests a p-type carrier character for the tested nanowires. A literature survey indicates that most previous electrical measurements on GaN:Mn thin films have shown n-type conductance behavior, [9-16], [21], which could be attributed to the high density of donor states under conduction-band edge, resulting from intrinsic defects. [13] I-V measurements of these nanowires has a low resistivity of $1.1 \times 10^{-2} \Omega \cdot cm$ for $V_g=0$ V at room temperature. This low resistivity, together with weak gating effect, indicates that high carrier concentration has been achieved within the nanowires of the present invention. The mobility is estimated from the transconductance:

$$dI/dV_g = \mu(C/L2)V_{sd},$$

where $\mu$ is the carrier mobility, C is the capacitance, and L is the length between source and drain. The nanowire capacitance is given by the equation:

$$C \sim 2\pi \in \in_0 L / \ln(2h/r),$$

where $\in$ is the dielectric constant, h is the thickness of the silicon oxide layer, and r is the nanowire radius. The carrier mobility was estimated as 70 cm$^2$/V·s. The mobility is low compared to those in bulk and/or thin film Mn:GaN, which could be explained by high carrier concentration by one-dimensional nanoscale confinement, or enhanced scattering in the nanoscale diameter of the nanowire. It is difficult to calculate the carrier density of heavily doped- and carrier confined nanowires due to difficulties in achieving full depletion of carriers by back-gate voltage. [22] Indeed, incomplete depletion in a range of −10 to 10 V of Vg was observed. A simple extrapolation leads to a carrier concentration of about $2 \times 10^{19}$ cm$^{-3}$. This value is higher than those in doped GaN thin films, however, lower than that assumed in the theoretical model (e.g., $3.5 \times 10^{20}$ cm$^{-3}$) for room temperature TC. [8]

Previous experimental measurements conducted on GaN: Mn thin films do not support hole mediated ferromagnetism as predicted by the theoretical model. However, test data suggests that the holes are possibly responsible for both charge transport and ferromagnetic interaction, i.e., observations made on the single-crystalline GaN:Mn nanowires of the present invention support the Zener model of hole-mediated room-temperature ferromagnetism for GaN:Mn. It is believed that the perfect single crystalline nature of the wires could exclude the effect of structural defects as well as secondary phases (which commonly exist in thin films), and make it possible to observe intrinsic ferromagnetism of this material.

As an exemplary new spintronic device structure based on DMS nanowires, the nanowires of the present invention were configured to create a GaN:Mn nanowire-based light emitting diode (LED) structure. FIG. 9A illustrates a schematic diagram for an exemplary GaN:Mn nanowire LED. Quasi-vertically aligned GaN:Mn nanowires 102 were grown on an n-SiC (0001) substrate using Ni catalysts. FIG. 10A illustrates an SEM image of the quasi-vertical nanowire arrays on the substrate. Ohmic contacts were achieved by evaporating an Ni/Au bilayer 108 on the nanowires 102 and Ni bilayer 106 on the substrate 104, followed by rapid thermal annealing. After metallization of substrate 104, a thick TaOx film 110 was deposited in a small area through a shadow mask where the nanowires 108 were removed. Ni and Au were then evaporated, resulting in a continuous contact layer on nanowires 102 and TaOx insulator 110. Measurements were carried out by probe 112 contact on TaOx film to power supply 114. FIG. 9C illustrates light LED emission 115 from LED 100.

Figure 10B:
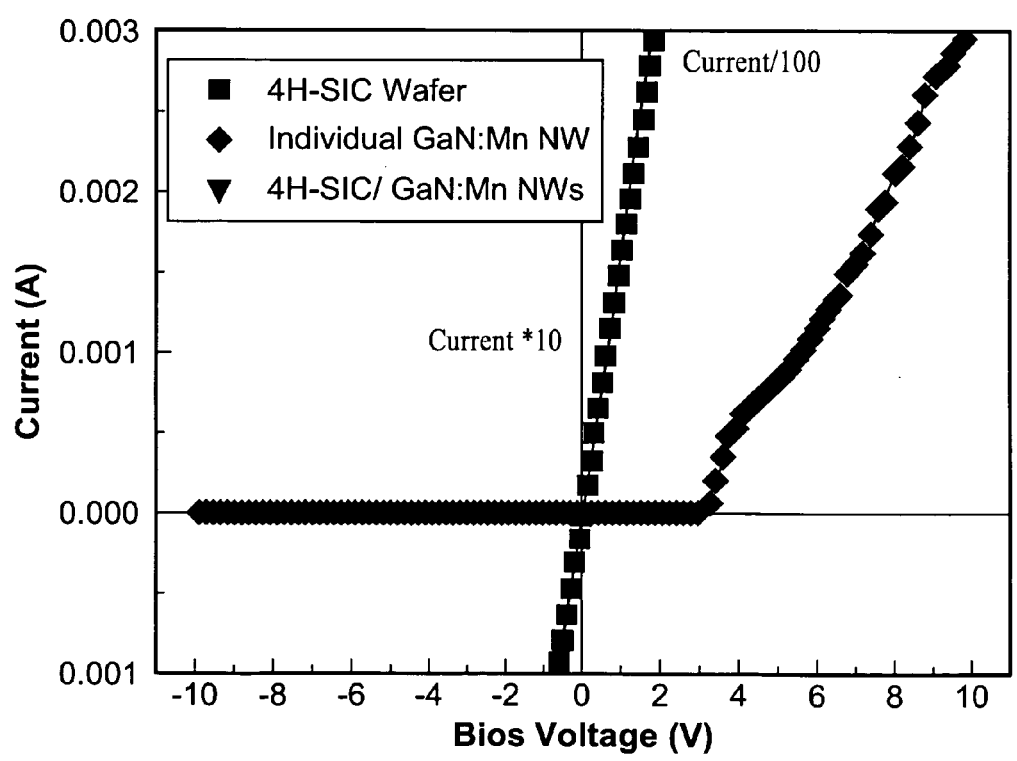
Figure 10C:
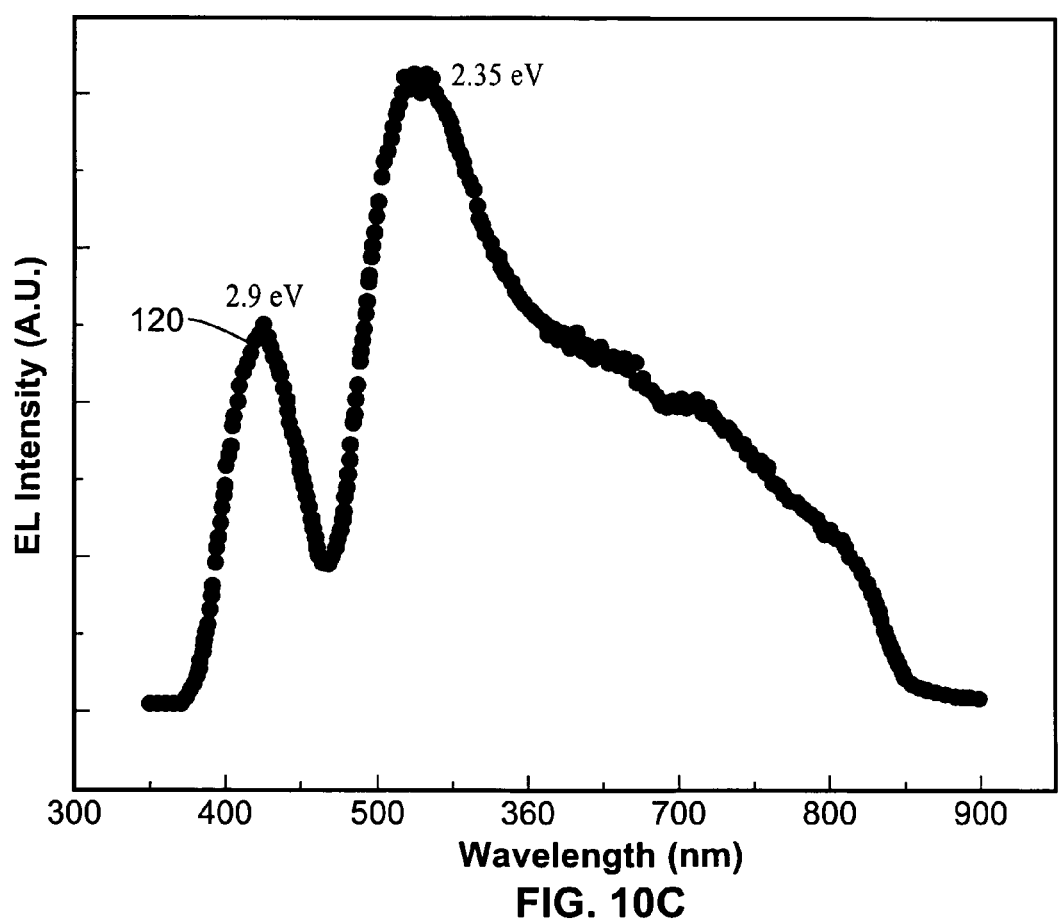

As illustrated in FIG. 10B, transport measurements made on the nanowire LED structures show well-defined current rectification characteristic of p-n diodes. Specifically, little current is observed in reverse bias up to −8V for source drain bias, and there is a sharp current turn-on at forward bias of about 3V. The I-V data recorded from the nanowires and substrate were symmetric, and thus we can attribute the rectification to the p-n junction between nanowires and substrate and not to nanowires-metal contacts. Significantly, electroluminescence (EL) spectra measurements on these junctions illustrated in FIG. 10C show a dominant emission peak 120 centered at 430 nm that is consistent with photoluminescence of the nanowires. The results of FIG. 10C further unambiguously confirm the p-type character of the GaN:Mn nanowires of the present invention.

Example 2

In accordance with the present invention, GaN:Mn nanowires 140 were grown by transporting gallium and manganese chloride (MnCl$_2$) onto a nickel coated sapphire substrate under flow of ammonia (NH$_3$) at 900° C. FIG. 11A shows a scanning electron microscopy (SEM) image of a nanowire 150 grown on the substrate. The diameter and length of these nanowires are 10-100 nm and tens of micrometers, respectively. FIGS. 11B and 11C show high resolution transmission electron microscopy (HRTEM) images of an individual nanowire 150. An X-ray diffraction pattern 152 further confirmed single-phase nature of these nanowires.

FIG. 11D shows the Mn concentration determined by the energy dispersive X-ray spectroscopy (EDS) analysis of the nanowires. The average Mn concentration measured from ten nanowires was 7% and Mn dopant was found be distributed homogeneously within the nanowire lattice.

The GaN:Mn nanowires were prepared according to the present invention by a equilibrium vapor transport process at high temperature. The transported Ga and MnCl$_2$, and NH$_3$ can produce GaN:Mn crystalline phase through the following reaction:

$$Ga+xMnCl_2+NH_3 \rightarrow Mn_xGa_{1-x}N+2xHCl+(3-2x)/2H_2.$$

In this reaction, MnCl$_2$ serves as a thermodynamically favorable transport agent for the formation of GaN:Mn phase as well as acting as a doping precursor.

The magnetic properties of the nanowires were determined using a SQUID magnetometer as shown in FIG. 4A. FIG. 12(a) shows magnetization loops of a nanowire sample. The magnetic hysteresis behavior and remanence were clearly observed at 5 K and 300 K, respectively. Temperature dependence of the magnetization, as shown in FIG. 12B, under 0.02 Tesla (T) and 0.5 T shows increase in magnetization below 10 K, which could be due to the coexistence of ferromagnetic and paramagnetic phases. Again, the Curie temperature $T_C$ is estimated to be above 300 K.

FIG. 13 shows a test device for testing the isothermal magnetoresistance (MR) of individual nanowire 150. To measure MR, nanowire 150 was positioned to span across two electrodes 156 on test substrate 154.

Referring now to FIG. 14, EELS analysis of the valence state of the Mn dopant in GaN was carried out in reference to the spectra acquired from standard specimens (MnO, Mn$_2$O$_3$ and MnO$_2$) having known cation oxidation states. Again, comparison of the shape and relative intensity ratios of the L$_3$ and L$_2$ lines unambiguously shows that the Mn dopants exist as Mn$^{2+}$ cations within the GaN matrix. Referring to FIG. 15, the PL spectrum again shows the appearance of broad emission at 2.5-3.2 eV.

To further probe the carrier type within these GaN:Mn nanowires, electrical conductance of nanowires was determined using nanowire-based FET structures. The devices were prepared by dispersing a suspension of nanowires in ethanol onto the surface of an oxidized silicon substrate, where the underlying silicon was used as a global back gate. Source and drain electrodes were made by deposition of platinum by using focused ion beam. The gate-dependent transport study suggests p-type carrier since the wire conductance increases slightly with decreasingly positive gate voltage.

Referring to FIGS. 16A and 16B, GaN homojunction structure 160 was assembled with silicon doped n-type GaN nanowires 162. The GaN nanowire homojunction exhibited rectifying behavior with a turn on voltage of approximately 3.4 V. This again points to the p-type characteristics of Mn doped GaN nanowires. This suggests that the holes are most likely responsible for both charge transport and ferromagnetic interaction. This observation the single-crystalline GaN:Mn nanowires of the present invention again supports the Zener model of hole-mediated room-temperature ferromagnetism for GaN:Mn.

The chloride-based transport approach to prepare single crystalline GaN:Mn nanowires in accordance with the present invention enables facile doping of transition metal ions into GaN matrix within these 1-dimensional nanostructures. This synthetic success leads to a new class of diluted magnetic semiconductor nanowires having a Curie temperature above room temperature, magnetoresistance near room temperature, as well as spin-dependent transport and p-type character. The p-type DMS GaN:Mn nanowires of the present invention open up new opportunities for fundamental research on the origin of ferromagnetism of diluted magnetic semiconductor. The availability of such nanowires also opens up new opportunities to realize the spintronic and optoelectronic devices at nanometer scale such as spin-LED, transistors and ultra-dense nonvolatile semiconductor memory.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for fabricating diluted magnetic semiconductor (DMS) nanowires, comprising:
   providing a catalyst-coated substrate; and
   subjecting at least a portion of the substrate to a semiconductor-based solution and a dopant-based solution;
   wherein said dopant-based solution comprises a dopant and a chloride-based vapor transport to aid in synthesis of the magnetic semiconductor nanowires.

2. A method as recited in claim 1, wherein said semiconductor-based solution comprises a binary semiconductor.

3. A method as recited in claim 1, wherein said semiconductor-based solution comprises an elemental semiconductor.

4. A method as recited in claim 1, wherein said dopant comprises a transition metal.

5. A method as recited in claim 2, wherein subjecting at least a portion of the substrate to a semiconductor-based solution and a dopant-based solution comprises transporting gallium (Ga) and manganese chloride ($MnCl_2$) onto the substrate under flow of ammonia ($NH_3$).

6. A method as recited in claim 1, further comprising controlling the composition of the nanowires by controlling the amount of chloride-based vapor.

7. A method as recited in claim 5, further comprising heating the substrate to a temperature in the range of 800° C. to 1000° C. prior to subjecting the substrate to gallium, manganese and chloride-based vapor.

8. A method as recited in claim 5, wherein the transported Ga, $MnCl_2$, and $NH_3$ produce GaN:Mn nanowires through a reaction comprising:

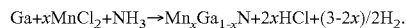

9. A method as recited in claim 5, wherein the gallium is also transported via a chloride-based vapor transport as $GaCl_3$.

10. A method as recited in claim 9, wherein the transported $GaCl_3$, $MnCl_2$, and $NH_3$ produce GaN:Mn nanowires through a reaction comprising:

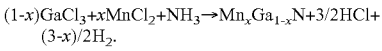

11. A method as recited in claim 1, wherein the nanowires are ferromagnetic with a Curie temperature above 300 Kelvin.

12. A method as recited in claim 1, wherein the nanowires have a magnetoresistance at temperatures up to 250 K.

13. A method as in claim 1, wherein providing a catalyst-coated substrate comprises providing a nickel-coated silicon carbide (SiC) substrate.

14. A method for synthesizing diluted magnetic semiconductor (DMS) nanowires, comprising:
   coating a substrate with a catalyst;
   heating the substrate to a temperature in the range of 800° C. to 1000° C.; and
   transporting a semiconductor and a dopant to at least a portion of the substrate;
   wherein said dopant is transported to the substrate via a chloride-based vapor to aid in synthesis of the magnetic semiconductor nanowires.

15. A method as recited in claim 14, wherein the semiconductor and dopant are transported as gaseous solutions.

16. A method as recited in claim 15, wherein the semiconductor comprises a binary semiconductor.

17. A method as recited in claim 16, wherein transporting a semiconductor and a dopant to at least a portion of the substrate comprises transporting gallium (Ga) and manganese chloride ($MnCl_2$) onto the substrate under flow of ammonia ($NH_3$).

18. A method as recited in claim 17, wherein the transported Ga, $MnCl_2$, and $NH_3$ produce GaN:Mn nanowires through a reaction comprising:

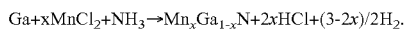

19. A method as recited in claim 17, wherein the gallium semiconductor is also transported to the substrate as $GaCl_3$.

20. A method as recited in claim 19, wherein the transported $GaCl_3$, $MnCl_2$, and $NH_3$ produce GaN:Mn nanowires through a reaction comprising:

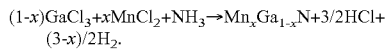

21. A method as recited in claim 20, wherein single crystalline GaN:Mn nanowires are produced with no phase separation.

22. A method as recited in claim 14, wherein coating a substrate with a catalyst comprises coating a silicon carbide (SiC) substrate with nickel.

23. A method for fabricating GaN:Mn nanowires, comprising:
   providing a catalyst-plated substrate; and
   transporting gallium and manganese metals onto the substrate;
   wherein the manganese is transported via a chloride-based vapor onto the substrate to form GaN:Mn nanowires.

24. A method as recited in claim 23, wherein the step of transporting gallium and manganese metals comprises transporting gallium chloride ($GaCl_3$) and manganese chloride ($MnCl_2$) onto the substrate under flow of ammonia ($NH_3$).

25. A method as recited in claim 24, wherein $MnCl_2$ serves as a thermodynamically favorable transport agent for the formation of GaN:Mn nanowires as well as acting as a doping precursor.

26. A method as recited in claim 23, wherein the nanowires are ferromagnetic.

27. A method as recited in claim 23, wherein the nanowires have a magnetoresistance.

28. A method as recited in claim 23, further comprising controlling the composition of the nanowires by controlling the amount of chloride-based vapor.

29. A method as recited in claim 23, further comprising heating the substrate to a temperature in the range of 800° C. to 1000° C.

* * * * *